United States Patent
Ishizuya et al.

(10) Patent No.: US 11,818,936 B2
(45) Date of Patent: Nov. 14, 2023

(54) DISPLAY DEVICE

(71) Applicant: CANON KABUSHIKI KAISHA, Tokyo (JP)

(72) Inventors: Koji Ishizuya, Kanagawa (JP); Norifumi Kajimoto, Kanagawa (JP); Yojiro Matsuda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 54 days.

(21) Appl. No.: 17/492,705

(22) Filed: Oct. 4, 2021

(65) Prior Publication Data
US 2022/0115447 A1  Apr. 14, 2022

(30) Foreign Application Priority Data
Oct. 12, 2020 (JP) ................. 2020-172135

(51) Int. Cl.
| | |
|---|---|
| *H10K 59/38* | (2023.01) |
| *G02B 27/01* | (2006.01) |
| *G02B 5/20* | (2006.01) |
| *H04N 23/53* | (2023.01) |
| *H10K 50/858* | (2023.01) |

(52) U.S. Cl.
CPC ............ *H10K 59/38* (2023.02); *G02B 5/201* (2013.01); *G02B 27/0172* (2013.01); *H04N 23/53* (2023.01); *H10K 50/858* (2023.02); *G02B 2027/0178* (2013.01)

(58) Field of Classification Search
CPC .... H04N 23/53; G02B 5/201; G02B 27/0172; G02B 2027/0178; G02B 2027/0112; H10K 59/38; H10K 50/858
See application file for complete search history.

(56) References Cited

U.S. PATENT DOCUMENTS

| | | |
|---|---|---|
| 6,822,783 B2 | 11/2004 | Matsuda et al. |
| 7,474,295 B2 | 1/2009 | Matsuda |
| 7,492,348 B2 | 2/2009 | Matsuda |
| 8,068,089 B2 | 11/2011 | Matsuda |
| 8,482,515 B2 | 7/2013 | Matsuda |
| 9,829,710 B1* | 11/2017 | Newell ............ H10K 59/1275 |
| 10,826,022 B2 | 11/2020 | Suzuki |
| 2011/0102651 A1* | 5/2011 | Tay .................. H01L 27/14687 348/294 |
| 2019/0305051 A1* | 10/2019 | Takahashi ............ H10K 59/35 |

(Continued)

FOREIGN PATENT DOCUMENTS

JP  2017-181831 A  10/2017

*Primary Examiner* — Lin Ye
*Assistant Examiner* — John H Morehead, III
(74) *Attorney, Agent, or Firm* — Venable LLP

(57) ABSTRACT

A display device is provided that has pixels including a first pixel and a second pixel arranged to be adjacent to each other along a first direction. The pixels include a light emitting region and a color filter. Luminous efficacy of the first pixel is higher than that of the second pixel. In a plane view, a center position of each color filter is shifted in the first direction from a center position of a corresponding light emitting region, and a length parallel to the first direction of the color filter of the first pixel is longer than that of the second pixel. In the first direction, each first pixel is periodically arranged and a pitch of the color filter of each first pixel and a pitch of the light emitting region of each first pixel are different from each other.

35 Claims, 20 Drawing Sheets

(56) References Cited

U.S. PATENT DOCUMENTS

| | | |
|---|---|---|
| 2019/0386250 A1 | 12/2019 | Suzuki |
| 2020/0273899 A1* | 8/2020 | Ogura ............... H01L 27/14609 |
| 2021/0028404 A1 | 1/2021 | Suzuki |
| 2021/0118959 A1 | 4/2021 | Sano et al. |
| 2021/0305323 A1 | 9/2021 | Ishizuya |
| 2022/0130924 A1* | 4/2022 | Takahashi .............. H10K 59/38 |

* cited by examiner

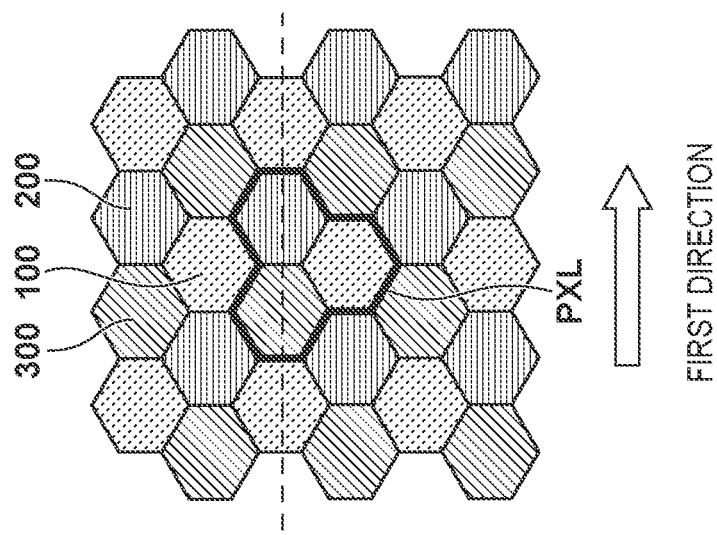
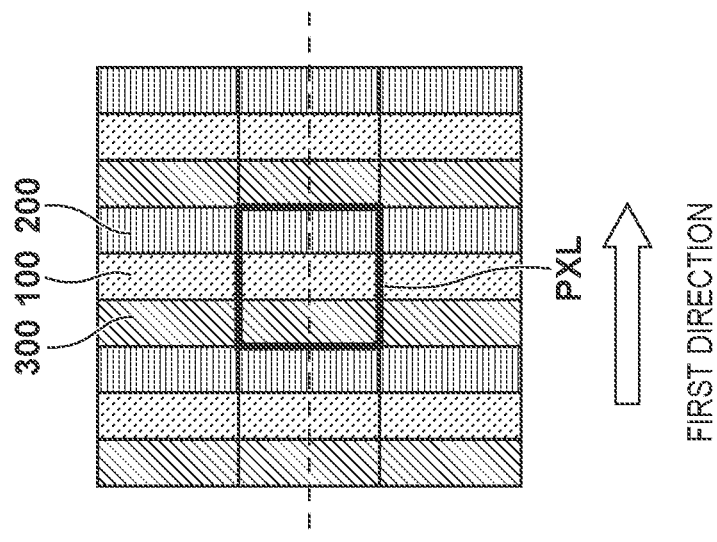
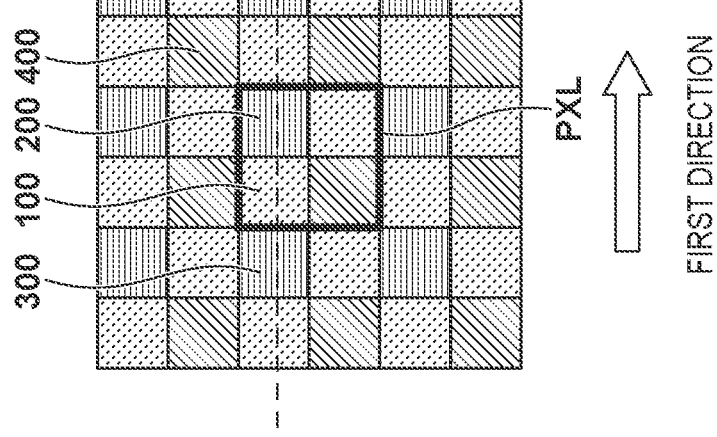

DISPLAY DEVICE

BACKGROUND OF THE INVENTION

Field of the Invention

The present invention relates to a display device.

Description of the Related Art

A display device that includes an organic EL light emitting element has gained attention. There is known a method (to be referred to as a white+CF method hereinafter) that uses a light emitting element that emits white light and a color filter to increase the precision of a display device. A display device with increased precision in pixel size, the pitch between the pixels, and the like can be used as, for example, an electronic viewfinder (EVF) of a camera or the like. As shown in FIG. 11, in an EVF, among the rays of light emitted from a display region DA of a display device 10, not only rays of light emitted toward a display surface in a normal direction but also rays of light emitted in a diagonal direction with respect to the normal direction will reach a user 30 via an optical system 20. Since there is, between a middle portion and each peripheral portion of the display region DA, an angular distribution in the ratio of use of light emitted in the normal direction and light emitted in the diagonal direction, unevenness tends to occur due to differences between the luminance and chromaticity of the middle portion and the luminance and chromaticity of each peripheral portion. Japanese Patent Laid-Open No. 2017-181831 discloses that characteristics with respect to a ray of light emitted in the diagonal direction among the rays of light emitted from a display surface can be improved in a display device that includes pixels using light emitting elements and color filters. More specifically, Japanese Patent Laid-Open No. 2017-181831 discloses that in at least some regions of the display surface, the center of each light emitting element and the center of each color filter are arranged so as to have a relative positional shift between them so that a ray of light emitted from the light emitting element in a diagonal direction will enter the corresponding color filter of the pixel.

In order to further improve the image quality, the display device according to the related art needs to more efficiently use light emitted diagonally with respect to the normal direction of the display surface.

SUMMARY OF THE INVENTION

Some embodiments of the present invention provide a technique advantageous in improving image quality in a display device.

According to some embodiments, a display device that comprises a display region in which a plurality of pixels including a first pixel and a second pixel are arranged to be adjacent to each other along a first direction, wherein each of the plurality of pixels comprises a light emitting region and a color filter arranged over the light emitting region, a center position of each color filter is arranged so as to be shifted closer to the first direction from a center position of a corresponding light emitting region in an orthogonal projection with respect to the display region, luminous efficacy of light transmitted through the color filter of the first pixel is higher than luminous efficacy of light transmitted through the color filter of the second pixel, in the orthogonal projection with respect to the display region, a length parallel to the first direction of the color filter of the first pixel is longer than a length parallel to the first direction of the color filter of the second pixel, each first pixel is periodically arranged along the first direction, the color filter of each first pixel is arranged at a predetermined pitch along the first direction, the light emitting region of each first pixel is arranged at a predetermined pitch along the first direction, and the pitch at which the color filter of each first pixel is arranged along the first direction and the pitch at which the light emitting region of each first pixel is arranged along the first direction are different from each other, is provided.

Further features of the present invention will become apparent from the following description of exemplary embodiments (with reference to the attached drawings).

BRIEF DESCRIPTION OF THE DRAWINGS

FIGS. 2A to 2C are views each showing an example of the arrangement of an image in the display device of FIG. 1;

DESCRIPTION OF THE EMBODIMENTS

Figure 1:
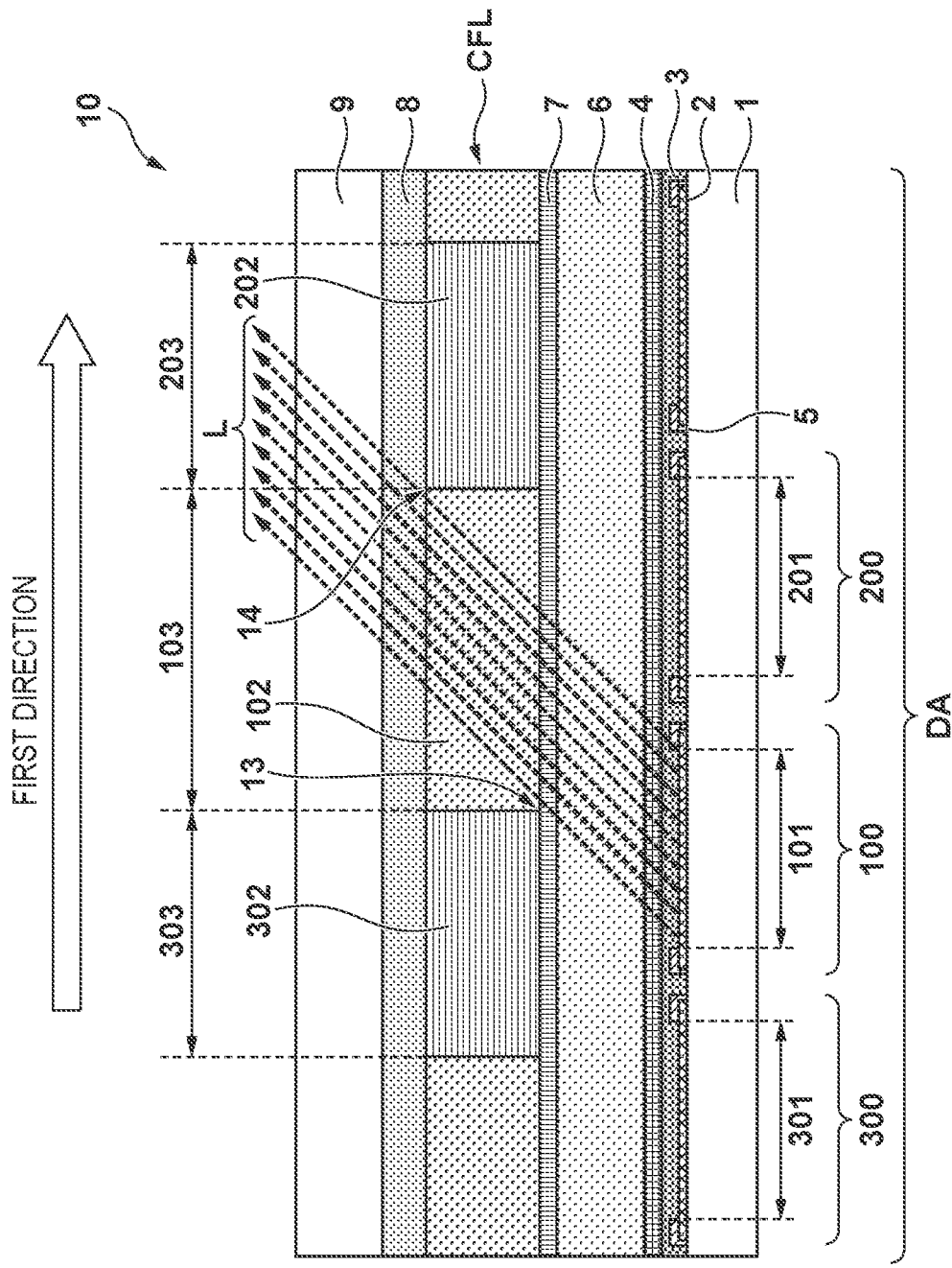
FIG. 1 is a view showing the outline of a display device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A display device according to an embodiment of the present disclosure will be described with reference to FIGS. 1 to 14. The characteristics of the display device according to this embodiment will be clarified by describing, first, the arrangement of a display device according to a comparative example and subsequently comparing the display device according to the comparative example and the display device according to the embodiment. In addition, this specification will describe an organic device using an organic light emitting element (organic EL element) in which an organic compound emits light in a light emitting region as an example of a display device. However, the present invention is not limited to this. As long as the display device is a display device that uses a color filter to display characters, images, and the like, this embodiment can be applied to various kinds of display devices such as a display using a liquid crystal panel, a projector, or the like. The display device shown in this embodiment can be used as, for example, a part of an electronic device that displays image data. Examples of an electronic device that includes the display device are a digital camera, a smartphone, a tablet, a portable game console, a television, and the like.

Figure 12:
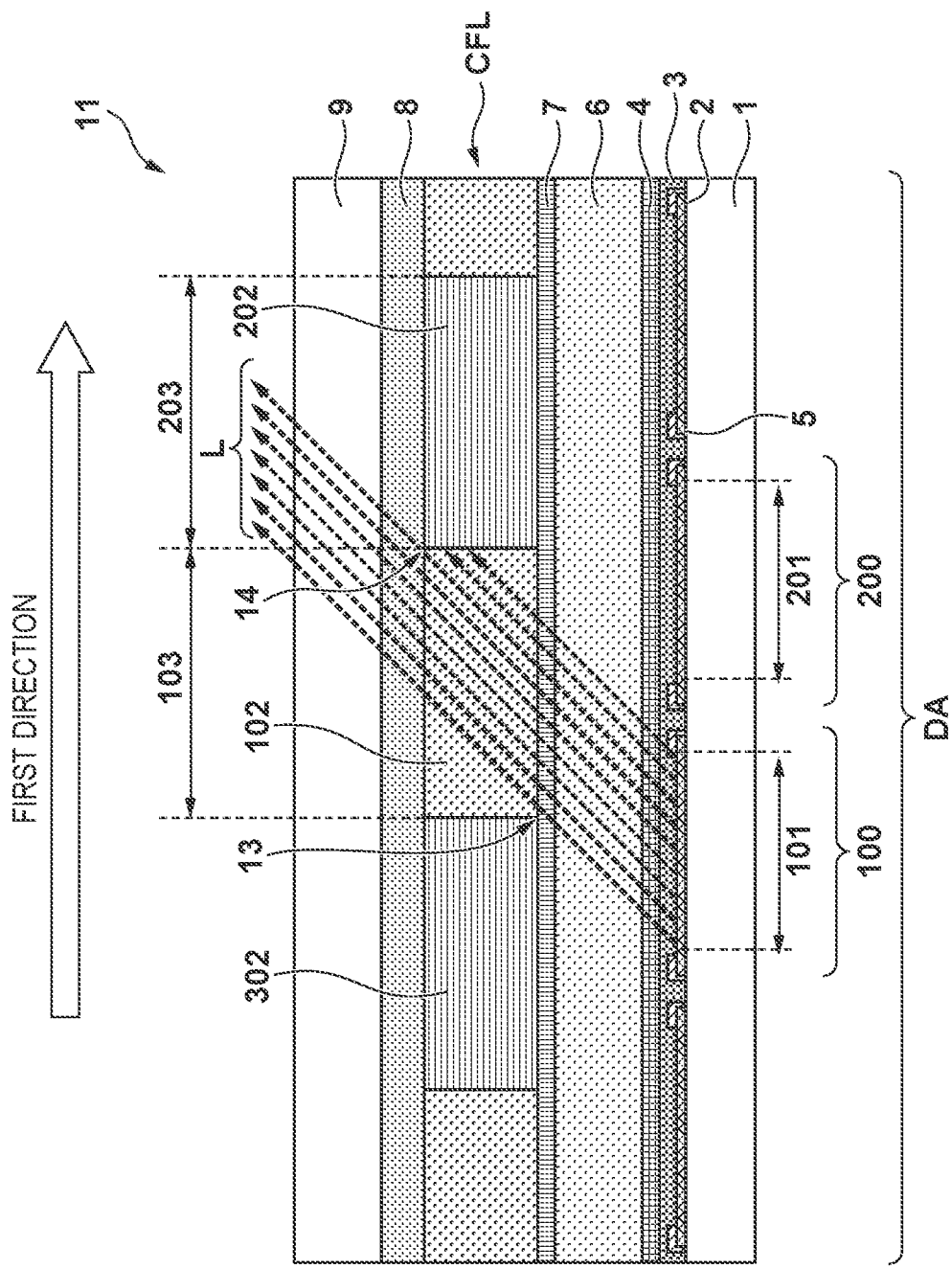
FIG. 12 is a view showing the outline of a display device according to a comparative example.

The display device according to a comparative example will be described first. FIG. 12 is a schematic sectional view of a display device 11 according to the comparative example. FIG. 12 is a sectional view of a region, in a display region DA of the display device 11, which mainly uses rays of light L emitted in a diagonal direction with respect to a normal direction of a display surface. The region which mainly uses the rays of light L emitted in the diagonal direction with respect to the normal direction of the display surface is, for example, a region near the edge of the display region DA in a case in which a magnification optical system is to be used as an optical system 20. Assume that the normal direction here is a vertical direction in FIG. 12. FIG. 12 shows a pixel 100 and a pixel 200 arranged so as to be adjacent to each other along a first direction. Assume that the first direction here is the right direction as shown in FIG. 12. In addition, the pixel 200 is arranged on the side of the first direction with respect to the pixel 100. The pixel 100 includes a light emitting region 101 which uses an organic light emitting element (organic EL element) and a color filter 102 arranged over the light emitting region 101. The center position of the color filter 102 is arranged so as to be shifted closer to the first direction than the center position of the light emitting region 101 in an orthogonal projection with respect to the display region DA. In a similar manner, the pixel 200 includes a light emitting region 201 and a color filter 202 arranged over the light emitting region 201. The center position of the color filter 202 is arranged so as to be shifted closer to the first direction than the center position of the light emitting region 201 in an orthogonal projection with respect to the display region DA. In this manner, each of the plurality of pixels includes a light emitting region and a corresponding color filter arranged over the light emitting region. Also, each color filter is arranged so that its center position will be shifted closer to the first direction than the center position of the corresponding light emitting region in an orthogonal projection with respect to the display region.

The center position of each of the light emitting regions 101 and 201 here can be, for example, the geometric center of gravity position of each of the light emitting regions 101 and 201 in an orthogonal projection with respect to the display region DA. In addition, for example, the center position of each of the light emitting regions 101 and 201 may be, for example, the center position of a square circumscribing the light emitting regions 101 and 201 and includes sides in the first direction and sides in a direction perpendicular to the first direction in an orthogonal projection with respect to the display region DA. Furthermore, in a case in which the shape of each of the light emitting regions 101 and 201 is a rectangle in an orthogonal projection with respect to the display region DA, the center position of each of the light emitting regions 101 and 201 may be, for example, the intersection of diagonal lines. In a similar manner, the center position of each of the color filters 102 and 202 can be, for example, the geometric center of gravity position of each of the color filters 102 and 202 in an orthogonal projection with respect to the display region DA. In addition, for example, the center position of each of the color filters 102 and 202 may be, for example, the center position of a square which circumscribes each of the color filters 102 and 202 and includes sides in the first direction and sides in a direction perpendicular to the first direction in an orthogonal projection with respect to the display region DA. Furthermore, in a case in which the shape of each of the color filters 102 and 202 is a rectangle, the center position of each of the color filters 102 and 202 may be, for example, the intersection of diagonal lines in an orthogonal projection with respect to the display region DA. The center position can be a position defined in the above-described manner in other arrangements as well.

The color filters 102 and 202 will be described next. The wavelength dependence of light transmittance of the color filter 102 is different from the wavelength dependence of light transmittance of the color filter 202. That is, the color filter 102 and the color filter 202 are color filters that transmit rays of light of different colors. Furthermore, the luminous efficacy of light that is transmitted through the color filter 102 is greater (higher) than the luminous efficacy of light that is transmitted through the color filter 202. For example, the color filter 102 of the pixel 100 can be a color filter that will transmit green light. Also, for example, the color filter 202 of the pixel 200 can be a color filter that will transmit red light or blue light.

A length 103 parallel to the first direction of the color filter 102 will be defined here. As shown in FIG. 12, the length 103 can be a length between the end in the first direction and the end in a direction opposite to the first direction of the color filter 102 in an orthogonal projection with respect to the display region DA. In other words, the length 103 can be a length between ends in a direction that intersects with the first direction of the color filter 102 in an orthogonal projection with respect to the display region DA. In addition, a case in which the light L emitted in the diagonal direction with respect to the normal direction of the display surface enters the color filter 102 which has a predetermined thickness is described in this embodiment. Hence, the length 103 parallel to the first direction of the color filter 102 can be, more precisely, the length from an end 13, which is in the direction opposite to the first direction in an orthogonal projection to a bottom surface of the color filter 102 with respect to the display region DA, to an end 14, which is in the first direction in an orthogonal projection to an upper surface of the color filter 102 with respect to the display region DA. As shown in FIG. 12, in a case in which the shape of the section of the color filter 102 in the first direction is a rectangle, it can be said that the length 103 is a length between the end in the first direction and the end in the direction opposite to the first direction of the color filter 102 in an orthogonal projection with respect to the display region DA. In a case in which the shape of the color filter 102 is a tapered shape or the like, the length 103 parallel to the first direction of the color filter 102 can be determined by using a more precise definition as described above. The lengths parallel to the first direction of other color filters, such as the color filter 202 and the like, can be determined in a similar manner.

In the display device 11 according to the comparative example shown in FIG. 12, the length 103 parallel to the first direction of the color filter 102 is the same length as a length 203 parallel to the first direction of the color filter 202. Here, the end of the color filter 102 in the first direction is a portion of the boundary where the color filter 102 and the color filter 202 are in contact with each other. In a similar manner, the end in the direction opposite to the first direction of the color filter 102 is a portion of the boundary where the color filter 102 and a color filter 302 which is adjacent to the color filter 102 in a direction opposite to the first direction are in contact with each other. This applies to other color filters in a similar manner. In a case in which each color filter has a tapered shape, the portions where the thicknesses of the color filters which are in contact with each other become the same can be assumed to be the ends of the respective color filters.

Figure 14:
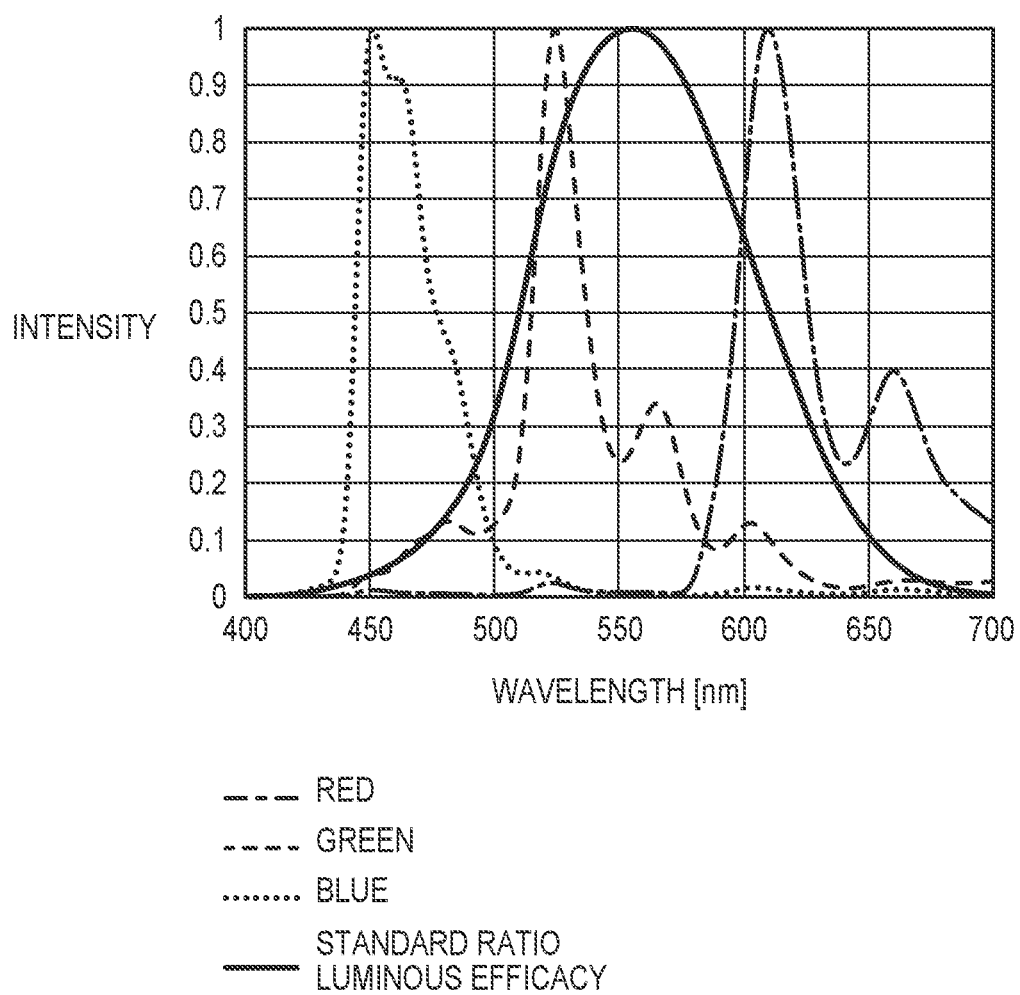
FIG. 14 is a graph showing the relationship between luminous efficacy and emitted light spectra.

The luminous efficacy of light will be described here. FIG. 14 is a graph showing the emitted light spectra of rays of light transmitted through color filters for transmitting red light, green light, and blue light. Each emitted light spectrum is standardized so that the peak intensity will be 1. Luminous efficacy Y of an emitted light spectrum is a value obtained by multiplying an emitted light spectrum EL(λ) with a standard ratio luminous efficacy curve y(λ) for each wavelength and integrating the product as follows.

$$Y = \int_{390}^{780} EL(\lambda)y(\lambda)d\lambda \quad (1)$$

For example, based on equation (1), the luminous efficacy of the emitted light spectrum of red light, the luminous efficacy of the emitted light spectrum of green light, and the luminous efficacy of the emitted light spectrum of blue light in FIG. 14 are 17, 31, and 4, respectively. As the numerical value of the luminous efficacy increases, the light will seem brighter for a person. That is, the luminance will increase. In addition, in the case of a general display device, white is displayed by, for example, additive color mixing by adjusting the luminance of each red pixel, the luminance of each green pixel, and the luminance of each blue pixel. For example, in a case where white according to the CIE standard illuminant D65 is to be expressed by the emitted light colors of red, green and blue of sRGB, the ratio of the intensity of the luminance of the red pixel:the luminance of the green pixel:the luminance of the blue pixel will be 0.21:0.72:0.07. In this manner, the ratio of the luminance of the green pixel will be high in displaying white. This is due to the high luminous efficacy of green light.

As described above, in the arrangement of the display device 11 according to the comparative example shown in FIG. 12, the length 103 parallel to the first direction of the color filter 102 is the same as the length 203 parallel to the first direction of the color filter 202. Here, the lengths 103 and 203 parallel to the first direction of the color filters 102 and 202 can be the lengths of the opening portions of the color filters 102 and 202, respectively, for transmitting light in the first direction. Some of the rays of light L emitted from the light emitting region 101 will be transmitted through the opening portion of the color filter 102 having the length 103. On the other hand, some of the rays of light L emitted from the light emitting region 101 will enter the adjacent color filter 202 after being transmitted through the color filter 102. The light that enters the color filter 202 after being transmitted through the color filter 102 will be absorbed by the color filter 202 because the wavelength dependence of light transmittance of the color filter 202 is different from the wavelength dependence of light transmittance of the color filter 102. This reduces the rays of light transmitted through the color filter 102 among the rays of light emitted from the light emitting region 101, thus reducing the luminance of the pixel 100. As described above, the luminous efficacy of light transmitted through the color filter 102 is set to be higher than the luminous efficacy of light transmitted through the color filter 202. Hence, if the rays of light that are transmitted through the color filter 102 decrease, the luminance of a portion of a display image that mainly uses the light emitted in the diagonal direction with respect to the normal direction of the display surface of the display region DA of the display device 11 will appear degraded. That is, unevenness due to varying luminance and chromaticity may occur in the display image and degrade the image quality.

Figure 13:
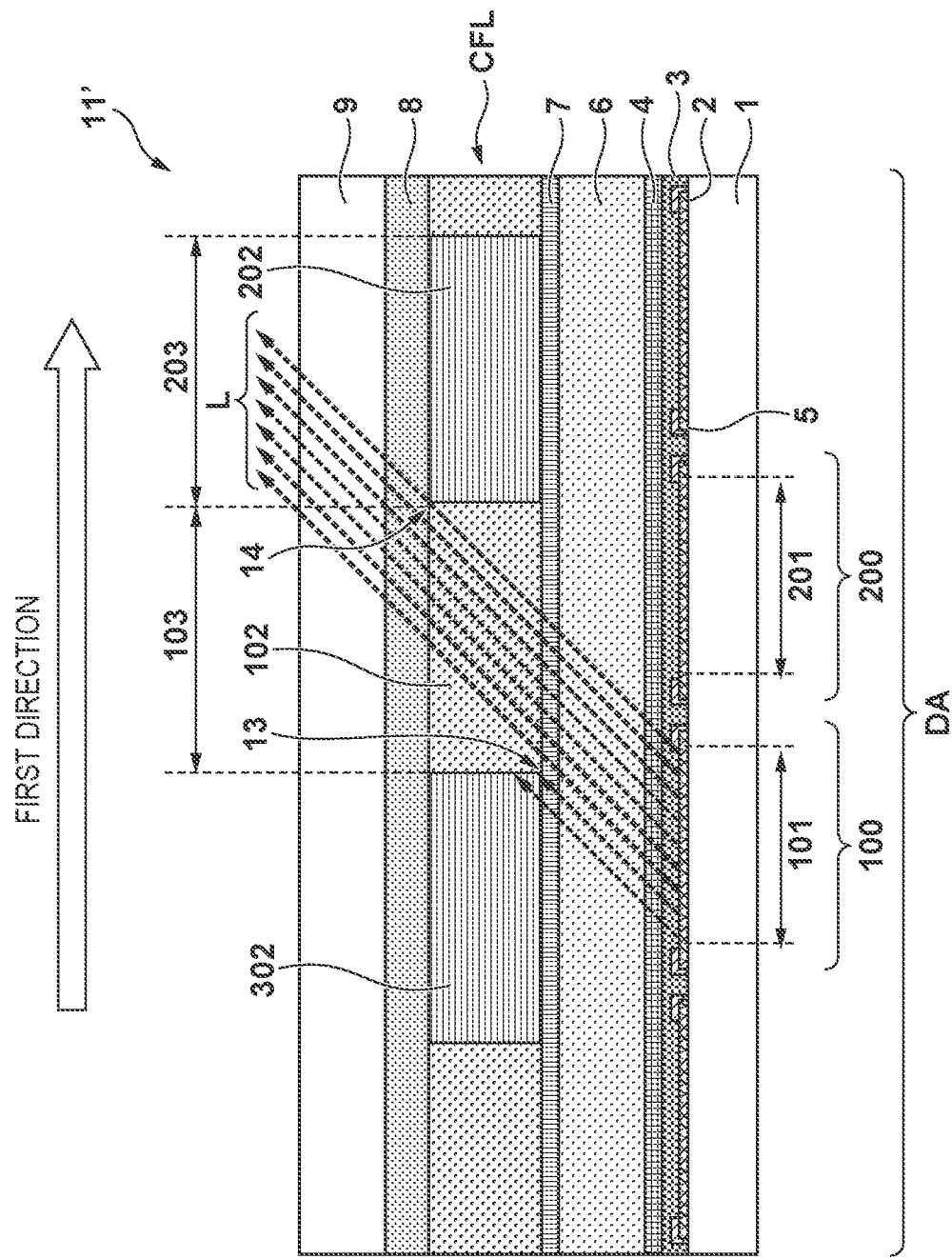
FIG. 13 is a view showing the outline of a display device according to another comparative example.

FIG. 13 is a schematic sectional view of a display device 11' according to another comparative example. Compared to the display device 11 shown in FIG. 12, in each of the pixels 100 and 200, the amount by which each of the color filters 102 and 202 has shifted in the first direction with respect to the corresponding one of the light emitting regions 101 and 201 has increased. In this case, some of the rays of light L emitted from the light emitting region 101 will enter the color filter 302 adjacent to the color filter 102 in a direction opposite to the first direction of the color filter 102. For example, the color filter 302 will transmit the light of the same color as the color filter 202. Hence, since the wavelength dependence of light transmittance of the color filter 102 is different from the wavelength dependence of light transmittance of the color filter 302, the light that enters the color filter 102 after being emitted from the light emitting region 101 and transmitted through the color filter 302 will be absorbed in the color filter 102.

In this manner, in the arrangement of each of the display devices 11 and 11' according to the comparative examples, the light L emitted from the light emitting region 101 may be absorbed due to the influence of the color filter 202 or the color filter 302 adjacent to the color filter 102. Hence, if the color filter 102 is to transmit light with high luminous efficacy in the manner described above, the luminance and the chromaticity of the image to be displayed will change, and the image quality may degrade.

A display device according to the present disclosure will be described next. FIG. 1 is a schematic sectional view of a display device 10 according to this embodiment. The display device 10 according to this embodiment includes a display region DA in which a plurality of pixels including a pixel 100 and a pixel 200 arranged to be adjacent to each other in the first direction are arranged. In addition, the plurality of pixels arranged in the display region DA include a pixel 300 which is arranged to be adjacent to the pixel 100 along the first direction. As shown in FIG. 1, the pixel 100 is arranged between the pixel 200 and the pixel 300. In other words, the plurality of pixels arranged in the display region DA include the pixel 300 and the pixel 200 arranged along the first direction and the pixel 100 arranged between the pixel 300 and the pixel 200 so as to be adjacent to the pixel 300 and the pixel 200. That is, the pixel 200 is arranged on the side of the first direction with respect to the pixel 100. Also, the pixel 300 is arranged on the side opposite to the first direction with respect to the pixel 100. In a similar manner to the display device 11 according to the comparative example described above, the luminous efficacy of light transmitted through a color filter 102 of the pixel 100 is higher than the luminous efficacy of light transmitted through each of a color filter 202 of the pixel 200 and a color filter 302 of the pixel 300. In addition, in the arrangement shown in FIG. 1, the rays of light of the same color can be transmitted through the color filter 202 of the pixel 200 and the color filter 302 of the pixel 300. Compared to the display device 11 according to the comparative example, a length 103 parallel to the first direction of the color filter 102 of the pixel 100 is longer than a length 203 parallel to the first direction of the color filter 202 of the pixel 200 in the display device 10 according to this embodiment. In addition, compared to the display device 11 according to the comparative example, the length 103 parallel to the first direction of the color filter 102 of the pixel 100 is longer than a length 303 parallel to the first direction of the color filter 302 of the pixel 300 in the display device 10.

In the display device 10 according to this embodiment, the length 103 parallel to the first direction of the color filter 102, that is, the opening portion through which the light emitted from a light emitting region 101 is transmitted is longer than that of the display device 11 according to the comparative example. This will reduce the possibility that light L that is emitted from the light emitting region 101 and passes near an end 14 on the side of the first direction of an upper surface of the color filter 102 will enter the color filter 202. In addition, it will be difficult for the light L emitted from the light emitting region 101 to enter the color filter 302 near an end 13 in the direction opposite to the first direction of a bottom surface of the color filter 102. As a result, the light emitted from the light emitting region 101 will be able to more easily pass through the color filter 102 with high luminous efficacy. In other words, it will be more difficult for the light emitted from the light emitting region 101 to be absorbed due to the influence of the color filters 202 and 302.

On the other hand, some rays of light emitted from light emitting regions 201 and 301 will be absorbed more easily by passing through the adjacent color filter 102. However, the luminous efficacy of light that is transmitted through each of the color filters 202 and 302 is lower compared to the luminous efficacy of light which is transmitted through the color filter 102. Thus, the influence on changes to luminance and chromaticity of the displayed image will be small when the display device 10 is considered as a whole. Hence, in the display device 10 according to this embodiment, since the length 103 parallel to the first direction of the color filter 102 is longer than the length 203 parallel to the first direction of the color filter 202 and the length 303 parallel to the first direction of the color filter 302, the attenuation of light transmitted through the color filter 102 with high luminous efficacy can be suppressed. As a result, it will be difficult for the luminance of the light emitted from the light emitting region 101 in the diagonal direction with respect to the normal direction of the display surface of the display region DA to decrease. Therefore, by more efficiently using the light emitted diagonally with respect to the normal direction of the display surface in accordance with each color transmitted by the corresponding color filter, it will be possible to improve the image quality when a user observes an image displayed on the display region DA of the display device 10.

This embodiment showed an example in which the pixels 200 and 300 which transmit rays of light of the same color as the pixel 100 are arrayed in the first direction. That is, the sectional view of the display device 10 shown in FIG. 1 can be, for example, the sectional view of a dotted line portion of the arrangement of color filters in a Bayer array shown in FIG. 2A. That is, the pixels 200 and 300, which can emit light including red or blue which has lower luminous efficacy of light to be transmitted than that of the pixel 100, are arranged adjacent to each pixel 100 which emits light including green which has high luminous efficacy of light to be transmitted. In addition, in a row adjacent to a direction intersecting with the first direction of the pixels 100, 200, and 300 on which the dotted line has been drawn, pixels that transmit green in a similar manner as each pixel 100 and pixels 400 that transmit a color different from red or blue of the pixels 200 and 300 are arrayed adjacently to each other. The pixels 100, 200, 300, and 400 can also be called subpixels. In the case of the Bayer array, one principal pixel PXL can be formed by arranging two pixels (pixels according to the pixel 100) for transmitting green light, one pixel (a pixel according to the pixel 200, 300, or 400) for transmitting red light, and one pixel (a pixel according to the pixel 200, 300, or 400) for transmitting blue light.

The pixels arranged along the first direction are not limited to the pixels of two colors as shown in FIGS. 1 and 2A. For example, three kinds of pixels 100, 200, and 300 that transmit rays of light of different colors from each other may be arrayed in the first direction as shown in a stripe array in FIG. 2B and in a delta array shown in FIG. 2C. That is, differing from the arrangement shown in FIGS. 1 and 2A, the color filters 102, 202, and 302 transmit rays of light of different colors from each other in the arrangements shown in FIGS. 2B and 2C. In each of the arrangements shown in FIGS. 2B and 2C, one principal pixel PXL can be formed by the three subpixels which are the pixels 100, 200, and 300 including three kinds of color filters 102, 202, and 302, respectively. The arrangement of the display device 10 in a case in which the pixels 100, 200, and 300 including the three kinds of color filters 102, 202, and 302, respectively, for transmitting different rays of light are arrayed along in the first direction, as shown in the dotted line portion of each of FIGS. 2B and 2C, will be described next.

Figure 3A:
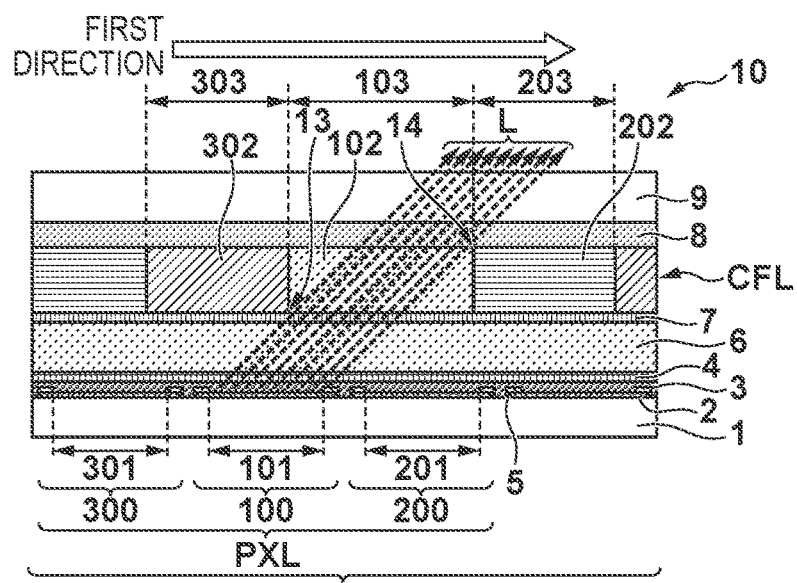
FIGS. 3A to 3C are views each showing the outline of a modification of the display device of FIG. 1.

FIG. 3A is a schematic sectional view of the display device 10 in which the pixels 100, 200, and 300 including the three kinds of color filters 102, 202, and 302, respectively, for transmitting different rays of light are arrayed along in the first direction. FIG. 3A is a sectional view of a region that mainly uses the light L emitted in the diagonal direction with respect to the normal line of the display surface in the display region DA of the display device 10. As shown in FIG. 3A, the pixel 200 is arranged on the side of the first direction with respect to the pixel 100 and the pixel 300 is arranged on the side opposite to the first direction with respect to the pixel 100. In addition, in the display device 10, the pixels 100, 200, and 300 include the light emitting regions 101, 201, and 301, respectively, and the color filters 102, 202, and 302 arranged over the light emitting region 101, 201, and 301, respectively. The center position of each of the color filters 102, 202, and 302 is arranged so as to be shifted closer to the first direction than the center position of the corresponding one of the light emitting region 101, 201, and 301 in an orthogonal projection with respect to the display region DA. In addition, the luminous efficacy of light transmitted through the color filter 102 of the pixel 100 is higher than the luminous efficacy of the light transmitted through each of the color filter 202 of the pixel 200 and the color filter 302 of the pixel 300. Furthermore, as described above, differing from the arrangement shown in FIG. 1, rays of light of different colors from each other will be transmitted through the color filters 202 and 302 of the pixels 200 and 300, respectively, which are adjacent to the pixel 100 in the first direction in the display device 10 shown in FIG. 3A.

In the display device 10 according to this embodiment, the length 103 parallel to the first direction of the color filter 102 of the pixel 100 in an orthogonal projection with respect to the display region DA is also longer than the length 203 parallel to the first direction of the color filter 202 of the pixel 200 and the length 303 parallel to the first direction of the color filter 302 of the pixel 300. Each of the length 103 of the color filter 102 of the pixel 100, the length 203 of the color filter 202 of the pixel 200, and the length 303 of the color filter 302 of the pixel 300 is, more precisely, the corresponding one of the length from the end in the direction opposite to the first direction in an orthogonal projection of the bottom surface of the color filter 102 with respect to the display region DA to the end in the first direction in an orthogonal projection to the upper surface of the color filter 102 with respect to the display region DA, the length from the end in the direction opposite to the first direction in an orthogonal projection of the bottom surface of the color filter 202 with respect to the display region DA to the end in the first direction in an orthogonal projection to the upper surface of the color filter 202 with respect to the display region DA, and the length from the end in the direction opposite to the first direction in an orthogonal projection of the bottom surface of the color filter 302 with respect to the display region DA to the end in the first direction in an orthogonal projection to the upper surface of the color filter 302 with respect to the display region DA.

In the display device 10 according to this embodiment, the length 103 parallel to the first direction of the color filter 102 of the pixel 100 with high luminous efficacy, that is, the opening portion through which the light emitted from the light emitting region 101 is transmitted is longer than those of the pixels 200 and 300 in a manner similar to the arrangement shown in FIG. 1. This will reduce the possibility that the light emitted from the light emitting region 101 and passes near the end 14 on the side of the first direction of the upper surface of the color filter 102 will enter the color filter 202. Also, it will be difficult for the light emitted from the light emitting region 101 to enter the color filter 302 near the end 13 in the direction opposite to the first direction of the bottom surface of the color filter 102. As a result, the light emitted from the light emitting region 101 will be able to more easily pass through the color filter 102 having high luminous efficacy. In other words, it will be more difficult for the light emitted from the light emitting region 101 to be absorbed due to the influence of the color filters 202 and 302.

On the other hand, some rays of light emitted from light emitting regions 201 and 301 will be absorbed more easily by passing through the adjacent color filter 102. However, the luminous efficacy of light that is transmitted through each of the color filters 202 and 302 is lower compared to the luminous efficacy of light which is transmitted through the color filter 102. Thus, the influence on changes to luminance and chromaticity will be small when the display device 10 is considered as a whole. Hence, in the display device 10 according to this embodiment, since the length 103 parallel to the first direction of the color filter 102 is longer than the lengths 203 and 303 parallel to the first direction in the color filters 202 and 302, the attenuation of light transmitted through the color filter 102 with high luminous efficacy can be suppressed. As a result, it will be difficult for the luminance of the light emitted from the light emitting region 101 in the diagonal direction with respect to the normal direction of the display surface of the display region DA to decrease. Therefore, in a similar manner to the arrangement shown in FIG. 1 described above, the light emitted diagonally with respect to the normal direction of the display surface can be used more efficiently in accordance with each color transmitted by the corresponding color filter. That is, it will be possible to improve the image quality when the user observes an image displayed on the display region DA of the display device 10.

As shown in FIGS. 1 and 3A, a case in which the length 103 parallel to the first direction of the color filter 102 of the pixel 100 is longer than both of the length 203 parallel to the first direction of the color filter 202 of the pixel 200 and the length 303 parallel to the first direction of the color filter 302 of the pixel 300 has been described. However, the present invention is not limited to this. For example, one of the length 203 parallel to the first direction of the color filter 202 and the length 303 parallel to the first direction of the color filter 302 may be shorter than the length 103 parallel to the first direction of the color filter 102. In this case, the other of the length 203 parallel to the first direction of the color filter 202 and the length 303 parallel to the first direction of the color filter 302 may be the same length as the length 103 parallel to the first direction of the color filter 102. By setting so that at least one of the length 203 parallel to the first direction of the color filter 202 and the length 303 parallel to the first direction of the color filter 302 will be shorter than the length 103 parallel to the first direction of the color filter 102, it will be possible to suppress the attenuation of light that is transmitted through the color filter 102 with high luminous efficacy. In addition, in a case in which the length 103 is longer than the lengths 203 and 303, the length 203 parallel to the first direction of the color filter 202 and the length 303 parallel to the first direction of the color filter 302 may be the same length. Also, for example, in a case in which the length 103 is longer than the lengths 203 and 303, the length 203 parallel to the first direction of the color filter 202 may be longer than the length 303 parallel to the first direction of the color filter 302. Furthermore, for example, in a case in which the length 103 is longer than the lengths 203 and 303, the length 303 parallel to the first direction of the color filter 302 may be longer than the length 203 parallel to the first direction of the color filter 202.

Figure 4A:
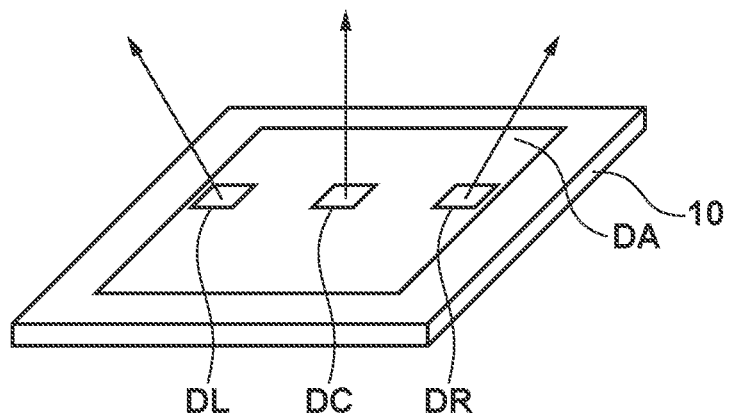
FIGS. 4A to 4C are views each showing an example of light emission directions of the display device of FIG. 1.
Figure 4B:
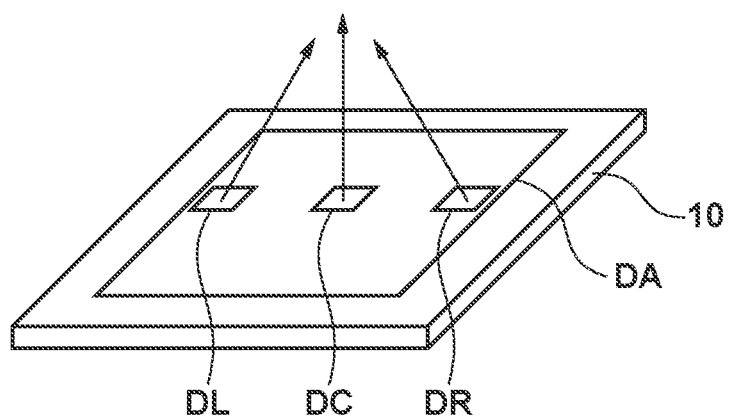
Figure 4C:
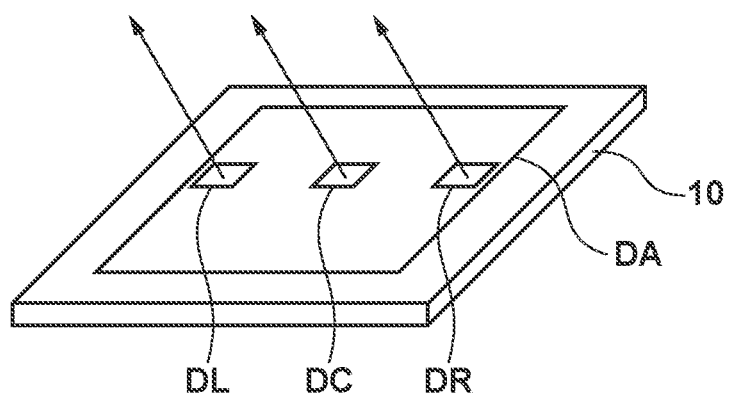

The first direction described above can be set arbitrarily in accordance with the arrangement of an optical system 20. For example, in peripheral regions DL and DR of the display region DA as shown in FIG. 4A, a case in which the optical system 20 will use the rays of light traveling toward the peripheral direction with respect to the normal direction of the display surface of the display region DA is considered. That is, for example, a case in which the optical system 20 functions like a convex lens such as a magnification optical system or the like as shown in FIG. 14 is considered. In this case, the first direction will be a direction from the middle of the display region DA toward an edge of the display region DA. In addition, in the peripheral regions DL and DR of the display region DA as shown in FIG. 4B, a case in which the optical system 20 uses the rays of light traveling in the center direction is considered. That is, for example, a case in which the optical system 20 functions like a concave lens is considered. In this case, the first direction will be a direction from the edge of the display region DA toward the middle of the display region DA. Furthermore, a case in which the optical system 20 uses the rays of light traveling toward a given direction in the entire display region DA as shown in FIG. 4C is considered. In this case, the first direction will be a direction from one end of the display region DA to the other end of the display region DA. In this manner, the first direction can be appropriately set in accordance with the arrangement of the optical system 20 to be used for the display device 10.

The entire arrangement of the display region DA in a case in which the optical system 20 uses the light traveling toward the peripheral direction in each of the peripheral regions DL and DR of the display region DA shown in FIG. 4A will be described next. In a case in which the optical system 20 is to use the light traveling toward the peripheral direction in each of the peripheral regions DL and DR of the display region DA, the arrangement of the pixels 100, 200, and 300 in the peripheral region DR, which is closer to the right side than the middle of the display region in FIG. 4A, will have, for example, a structure as shown in FIG. 3A. That is, the first direction will be the right direction as shown in FIG. 3A, and the center position of each of the color filters 102, 202, and 302 will be arranged so as to be shifted closer to the right side than the center position of the corresponding one of the light emitting regions 101, 201, and 301.

Figure 3B:
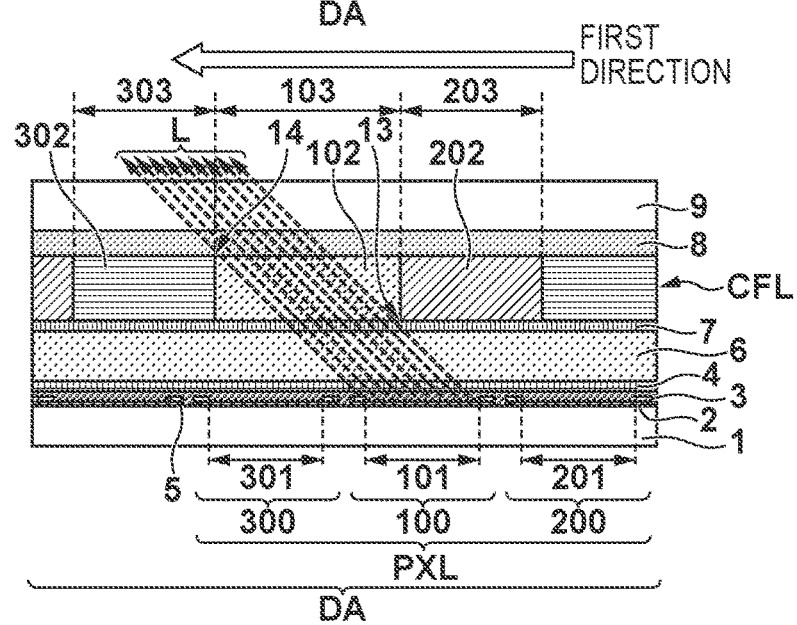

On the other hand, FIG. 3B is a schematic sectional view of the peripheral region DL on the left side of display region DA in FIG. 4A. In FIG. 3B, the first direction is the left direction. Hence, the center position of each of the color filters 102, 202, and 302 will be arranged so as to be shifted closer to the left side than the center position of the corresponding one of the light emitting regions 101, 201, and 301. Although the pixels are arranged along the first direction in the order of the pixel 300, the pixel 100, and the pixel 200 in the arrangement shown in FIG. 3A, the pixels will be arranged along the first direction in the order of the pixel 200, the pixel 100, and the pixel 300 in the arrangement shown in FIG. 3B.

Even in the arrangement shown in FIG. 3B, the length 103 parallel to the first direction of the color filter 102 of the pixel 100 with high luminous efficacy, that is, the opening portion through which the light emitted from the light emitting region 101 is transmitted is set longer than those of the pixels 200 and 300 in a manner similar to the arrangement shown in FIG. 3A. This will reduce the possibility that the light emitted from the light emitting region 101 and passes near the end 14 on the side of the first direction of the upper surface of the color filter 102 will enter the color filter 302. Also, it will be difficult for the light emitted from the light emitting region 101 to enter the color filter 202 near the end 13 in the direction opposite to the first direction of the bottom of the color filter 102. As a result, the light emitted from the light emitting region 101 will be able to more easily pass through the color filter 102 having high luminous efficacy. Therefore, in a similar manner to the arrangement shown in FIG. 3A, it will be more difficult for the luminance of the light emitted in the diagonal direction with respect to the normal direction of the display surface of the display region DA to decrease.

Figure 3C:
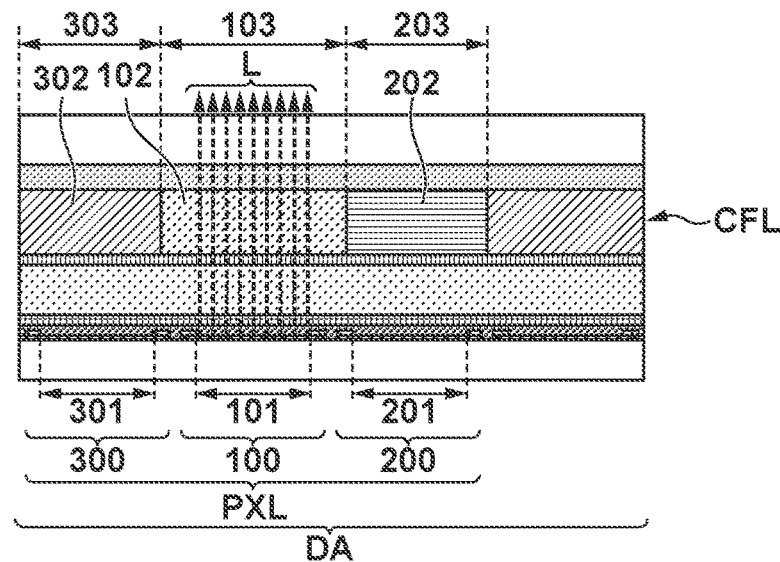

In addition, FIG. 3C is a schematic sectional view of the position of a middle region DC of the display region DA in FIG. 4A. The middle region DC of the display region DA will mainly use the light traveling toward the normal direction with respect to the display surface of the display region DA. Hence, for example, in the middle region DC, the shift amount between the center position of each of the color filters 102, 202, and 302 and the center position of the corresponding one of the light emitting regions 101, 201, and 301 is smaller than that of each of the peripheral regions DL and DR. Furthermore, in the middle region DC, as shown in FIG. 3C, the center position of each of the color filters 102, 202, and 302 may match the center position of the corresponding one of the light emitting regions 101, 201, and 301.

In the display device 10 according to this embodiment, the distribution of the shift amounts between the center positions of the color filters 102, 202, and 302 and the center positions of the light emitting regions 101, 201, and 301, respectively, in the display region DA can be set appropriately. For example, the display region DA can be divided into a plurality of sections, and a shift amount can be set for each section. In other words, the shift amount between the center position of each color filter 102 and the center position of each light emitting region 101, the shift amount between the center position of each color filter 202 and the center position of each light emitting region 201, and the shift amount between the center position of each color filter 302 to the center position of the light emitting region 301 can be changed stepwise from the middle region to the peripheral regions of the display region DA. Furthermore, the shift amount between the center position of each color filter 102 and the center position of each light emitting region 101, the shift amount between the center position of each color filter 202 and the center position of each light emitting region 201, and the shift amount between the center position of each color filter 302 to the center position of the light emitting region 301 can also be changed continuously from the middle region to the peripheral regions of the display region DA without complicating the design of the arrangement of the color filters 102, 202, and 302.

More specifically, each pixel 100 is arranged periodically along the first direction, the color filter 102 of each pixel 100 is arranged at a predetermined pitch along the first direction, and the light emitting region 101 of each pixel 100 is similarly arranged at a predetermined pitch along the first direction. In this case, the pitch at which the color filter 102 of each pixel 100 is arranged along the first direction will be different from the pitch at which the light emitting region 101 of each pixel 100 is arranged along the first direction. More specifically, the pitch at which the color filter 102 of each pixel 100 is arranged along the first direction can be larger than the pitch at which the light emitting region 101 of each pixel 100 will be arranged along the first direction. As a result, the shift amount between the center position of each color filter 102 and the center position of each light emitting region 101 can be continuously changed from the middle region DC to the peripheral regions DL and DR and to even the edge portion of the display region DA along the first direction.

In addition, as shown in FIG. 1, in a case in which pixels for transmitting two kinds of light are to be arrayed along the first direction, the pixel 200 (or the pixel 300 which transmits light of the same color as the pixel 200) will be arranged between the pixels 100 to be periodically arranged. At this time, each pixel 200 will be periodically arranged along the first direction, the color filter 202 of each pixel 200 will be arranged at a predetermined pitch along the first direction, and the light emitting region 201 of each pixel 200 will be similarly arranged at a predetermined pitch along the first direction. In this case, the pitch at which the color filter 202 of each pixel 200 is arranged along the first direction will be different from the pitch at which the light emitting region 201 of each pixel 200 is arranged along the first direction.

More specifically, the pitch at which the color filter 202 of each pixel 200 is arranged along the first direction can be larger than the pitch at which the light emitting region 201 of each pixel 200 is arranged along the first direction. As a result, the shift amount between the center position of each color filter 102 and the center position of each light emitting region 101 and the shift amount between the center position of each color filter 202 and the center position of each light emitting region 201 can be continuously changed from the middle region DC to the peripheral regions DL and DR and even further to the edge portion of the display region DA along the first direction.

Also, in this case, the pitch at which the color filter 102 of each pixel 100 is arranged along the first direction may be equal to the pitch at which the color filter 202 of each pixel 200 is arranged along the first direction. Furthermore, the pitch at which the light emitting region 101 of each pixel 100 is arranged along the first direction may be the same pitch as the pitch at which the light emitting region 201 of each pixel 200 is arranged along the first direction.

In addition, as shown in FIG. 3A, in a case in which pixels for transmitting three kinds of light are to be arrayed along the first direction, the pixel 200 and the pixel 300 will be arranged between the pixels 100 to be periodically arranged. At this time, the each of the pixels 200 and 300 is periodically arranged along the first direction, the color filter 202 of each pixel 200 and the color filter 302 of each pixel 300 will be arranged at a predetermined pitch along the first direction, and the light emitting region 201 of each pixel 200 and the light emitting region 301 of each pixel 300 will be similarly arranged at a predetermined pitch along the first direction. In this case, the pitch at which each of the color filters 202 of the pixels 200 and the color filters 302 of the pixels 300 is arranged along the first direction will be different from the pitch at which each of the light emitting regions 201 of the pixels 200 and the light emitting regions 301 of the pixels 300 is arranged along the first direction. More specifically, the pitch at which each of the color filters 202 of the pixels 200 and the color filters 302 of the pixels 300 is arranged along the first direction can be larger than the pitch at which each of the light emitting regions 201 of the pixels 200 and the light emitting regions 301 of the pixels 300 is arranged along the first direction. As a result, the shift amount between the center position of each color filter 102 and the center position of each light emitting region 101, the shift amount between the center position of each color filter 202 and the center position of each light emitting region 201, and the shift amount between the center position of each color filter 302 to the center position of the light emitting region 301 can be continuously changed from the middle region DC to the peripheral regions DL and DR and even further to the edge portion of the display region DA along the first direction.

In addition, the pitch at which the color filter 102 of each pixel 100 is arranged along the first direction, the pitch at which the color filter 202 of each pixel 200 is arranged along the first direction, and the pitch at which the color filter 302 of each pixel 300 is arranged along the first direction may be the same. Furthermore, the pitch at which the light emitting region 101 of each pixel 100 is arranged along the first direction, the pitch at which the light emitting region 201 of each pixel 200 is arranged along the first direction, and the pitch at which the light emitting region 301 of each pixel 300 is arranged along the first direction may also be the same. For example, the distance from the center position of the color filter 102 of the pixel 100 to the center position of the color filter 202 of the pixel 200 can be the same distance as the distance from the center position of the color filter 102 of the pixel 100 to the center position of the color filter 302 of the pixel 300. In a similar manner, the distance from the center position of the light emitting region 101 of the pixel 100 to the center position of the light emitting region 201 of the pixel 200 can be the same distance as the distance from the center position of the light emitting region 101 of the pixel 100 to the center position of the light emitting region 301 of the pixel 300. In this case, the distance from the center position of the color filter 102 of the pixel 100 to the center position of the color filter 202 of the pixel 200 can be different from the distance from the center position of the light emitting region 101 of the pixel 100 to the center position of the light emitting region 201 of the pixel 200.

Figure 5:
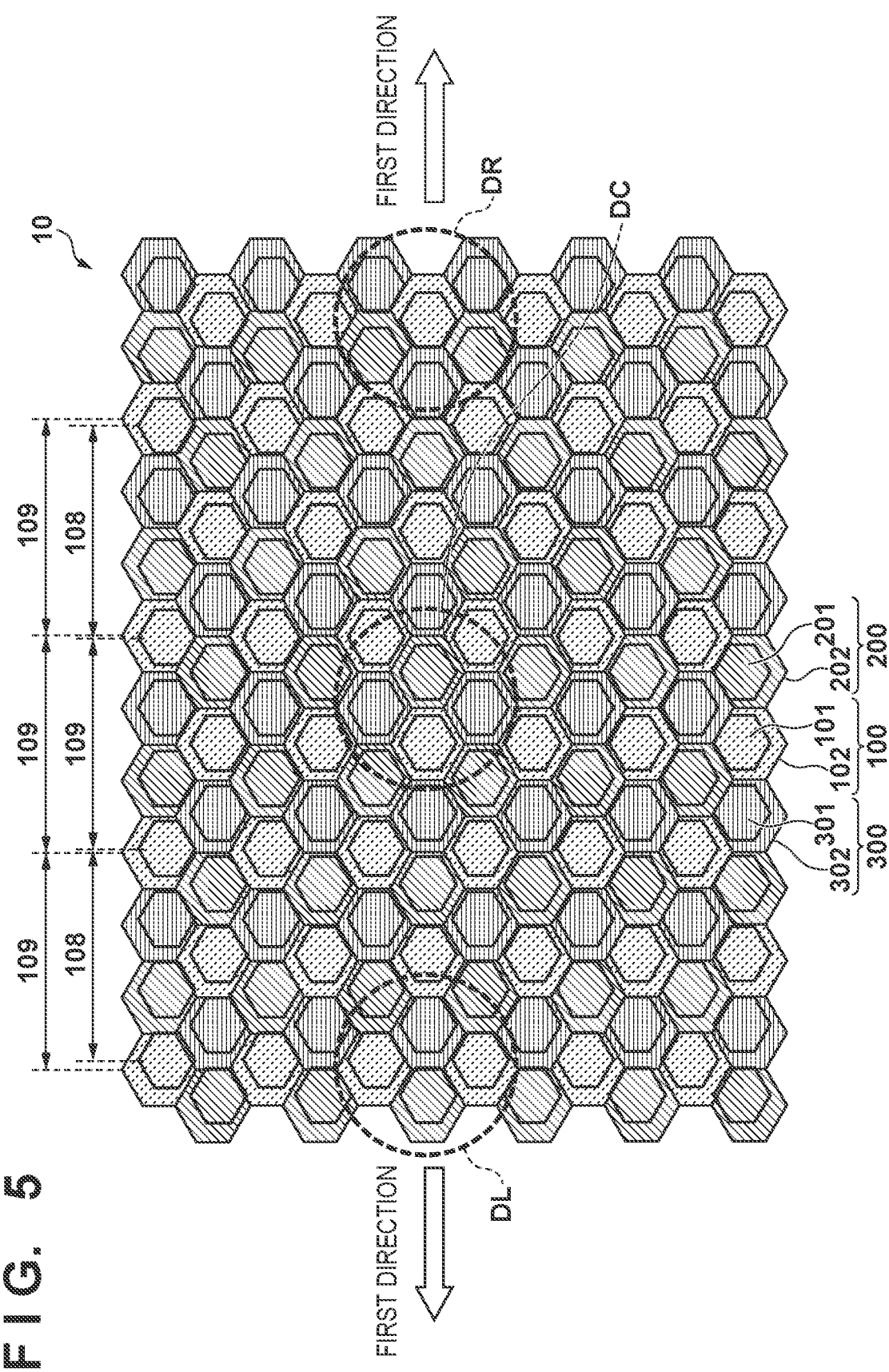
FIG. 5 is a view showing an example of the arrangement of color filters and light emitting regions in the display device of FIG. 1.

FIG. 5 is a schematic view of a case in which the shift amount between the center position of each color filter 102 and the center position of each light emitting region 101, the shift amount between the center position of each color filter 202 and the center position of each light emitting region 201, and the shift amount between the center position of each color filter 302 to the center position of the light emitting region 301 are to be continuously changed from the middle region DC to the peripheral regions DL and DR of the display region DA. FIG. 5 can show the relationship of the arrangement between the color filters 102, 202, and 302 and the light emitting regions 101, 201, and 301 in a case in which the optical system 20 uses the rays of light traveling toward the peripheral direction in the peripheral regions DL and DR of the display region DA shown in FIG. 4A.

A pitch 108 at which the light emitting region 101 of each pixel 100 is periodically arranged is the same in the display region DA. In a similar manner, a pitch 109 at which the color filter 102 of each pixel 100 is periodically arranged is the same in the display region DA. Here, the pitch 109 at which each color filter 102 is arranged is larger than the pitch 108 at which each light emitting region 101 is arranged. By setting such an arrangement, the center position of each color filter 102 will have a small shift amount (or will not be shifted) with respect to the center position of the corresponding light emitting region 101 in the middle region DC of the display region DA. On the other hand, in the peripheral regions DL and DR, the center position of each color filter 102 will be shifted with respect to the center position of the corresponding light emitting region 101. In addition, in each of the region between the middle region DC and the peripheral region DL and the region between the middle region DC and the peripheral region DR, the shift amount between the center position of each color filter 102 and the center position of the corresponding the light emitting region 101 is smaller than that in the peripheral regions DL and DR. Although the horizontal direction of FIG. 5 has been described here, a similar design method can be applied in the vertical direction and in the diagonal direction. In addition, a similar design method can be applied also to the pixels 200 and 300. In this manner, in the display device 10 according to this embodiment, the shift amount between the center position of each color filter 102 and the center position of each light emitting region 101, the shift amount between the center position of each color filter 202 and the center position of each light emitting region 201, and the shift amount between the center position of each color filter 302 to the center position of the light emitting region 301 can be continuously changed from the middle region DC to the peripheral regions DL and DR and even further to the edge portion of the display region DA without complicating the design related to the arrangement of the color filters. In addition, in each of the region between the middle region DC and the peripheral region DL and the region between the middle region DC and the peripheral region DR, the length 103 parallel to the first direction of each of the color filter 102, the length 203 parallel to the first direction of the color filter 202, and the length 303 parallel to the first direction of the color filter 302 may be approximately the same. The color filter design can be simplified by setting so that the lengths 103, 203, and 303 parallel to the first direction in the color filters 102, 202, and 302, respectively, will be approximately the same in the display region DA.

Components of the display device 10 according to this embodiment described with reference to FIGS. 1 to 5 will be described in more specific detail hereinafter. A substrate 1 is not particularly limited as long as it is a material that can support lower electrodes 2, an organic compound layer 3, an upper electrode 4, and the like. For example, quartz, glass, plastic, silicon, a resin, a metal, or the like may be used as the substrate 1. Switching elements such as transistors or the like, wiring lines, interlayer insulating film, and the like can be formed in the substrate 1 or on the substrate 1.

The lower electrodes 2 of the respective pixels 100, 200, and 300 are electrically isolated from each other. In the point of view of light emission efficiency, each lower electrode 2 can be made of a metal material having a reflectance of visible light of 50% or more. More specifically, each lower electrode 2 can be made of a metal such as aluminum (Al), silver (Ag), or the like or an alloy made by doping such a metal with silicon (Si), copper (Cu), a nickel (Ni), neodymium (Nd), titanium (Ti), or the like. In addition, each lower electrode 2 may include a barrier layer on its surface on the side of the organic compound layer 3 for emitting light. A metal such as Ti, tungsten (W), molybdenum (Mo), gold (Au), or the like or an alloy of these metals, or a transparent conductive oxide such as an indium tin oxide (ITO), an indium zinc oxide (IZO), or the like can be used for the barrier layer.

In a case in which a transparent conductive oxide is used for the barrier layer to optimize optical interference, the pixels 100, 200, and 300 may have different film thicknesses of the transparent conductive oxide from each other in accordance with the colors of light to be transmitted by the respective color filters 102, 202, and 302. As another method of optimizing optical interference, an insulating film can be formed between the transparent conductive oxide and a metal or an alloy of this metal. In such a case, it can be said that the transparent conductive oxide will function as the lower electrode 2. In this case, the transparent conductive oxide may be electrically connected to the metal or the alloy of this metal via a conductive member filled in a through hole provided in the insulating film or may be electrically isolated from the metal or the alloy of this metal. It is sufficient as long as the transparent conductive oxide is electrically connected so as to function as each lower electrode 2. Also, in such a case, the pixels 100, 200, and 300 may have different film thicknesses from each other for at least one of the insulating film and the transparent conductive oxide.

The organic compound layer 3 can be arranged over all or some of the pixels 100, 200, and 300 arranged in the display region DA, that is, arranged in common for the pixels 100, 200, and 300. The organic compound layer 3 can be formed by using, for example, a known technique such as vapor deposition, spin coating, or the like. For example, the organic compound layer 3 can be arranged continuously in the entire display region DA.

The organic compound layer 3 is a layer that includes at least a light emitting layer for emitting light, and may be formed by a plurality of layers. The plurality of layers may include, a hole injection layer, a hole transport layer, an electron blocking layer, a light emitting layer, a hole blocking layer, an electron transport layer, an electron injection layer, and the like. These layers are not limited to organic compounds and may include inorganic compounds. The light emitting element forming each of the light emitting regions 101, 201, and 301 of the display device 10 can be called an organic light emitting element (organic EL element) by arranging so that the main light emission is generated by an organic compound.

The organic compound layer 3 may emit white light from the light emitting layer by causing the holes injected from an anode and the electrons injected from a cathode to recombine in the light emitting layer. The light emitting layer can be formed by a plurality of layers. In this case, for example, the plurality of light emitting layers can include a red light emitting material, a green light emitting material, and a blue light emitting material, and white light can be obtained by mixing the light emission colors. In addition, for example, the plurality of light emitting layers may also include light emitting materials which emit rays of light having a complementary color relationship, such as a blue light emitting material, a yellow light emitting material, and the like.

An electron injection layer may be arranged between the organic compound layer 3 and the upper electrode 4. The electron injection layer can be made of a compound with a high electron donating property. A compound with a high electron donating property can be, for example, an alkali metal such as lithium (Li) or cesium (Cs), a metal with high electron donating property such as an alkaline earth metal such as calcium (Ca), barium (Ba), or a compound of such metals, or the like. A compound with a high electron donating property may be an organic metal complex formed by combining an organic compound and a metal raised here. The electron injection layer may have a single layer structure, may have a stacked layer structure, or may be a layer combined with an organic compound of an electron transport layer.

The upper electrode 4 can be arranged over all or some of the pixels 100, 200, and 300 arranged in the display region DA, that is, arranged in common for the pixels 100, 200, and 300. The upper electrode 4 has transmissivity. The upper electrode 4 may be made of a semi-transmissive material having a property (that is, a semi-transmissive reflection property) of partially transmitting and partially reflecting light which has reached the surface of the electrode. The upper electrode 4 can be made of a transparent material such as a transparent conductive oxide or the like, a metal such as Al, Ag, Au, or the like, an alkali metal such as Li or Cs, an alkaline earth metal such as a magnesium (Mg), Ca, Ba, or the like, or a semi-transmissive material made of an alloy material including these metal materials. The semi-transmissive material may also be an alloy mainly containing magnesium or silver. The upper electrode 4 may have a structure formed by stacking layers of the materials described above as long as an appropriate transmittance can be obtained. In one example, each lower electrode 2 can be the anode and the upper electrode 4 can be the cathode. However, in another example, each lower electrode 2 can be the cathode and the upper electrode 4 can be the anode.

An insulating layer 5 can be arranged between the lower electrodes 2 of the respective pixels 100, 200, and 300. The insulating layer 5 can be arranged, for example, so as to cover the ends of the lower electrode 2 of each of the pixels 100, 200, and 300, and can include an opening which will expose a region inside the ends of the lower electrode 2. This arrangement will allow the insulating layer 5 to define each of the light emitting regions 101, 201, and 301 of the respective pixels 100, 200, and 300. If the insulating layer 5 is not to be arranged, each of the light emitting regions 101, 201, and 301 can be defined by the shape of the lower electrode 2 itself. The insulating layer 5 can be made of an inorganic material such as silicon nitride (SiN), silicon oxynitride (SiON), silicon oxide (SiO), or the like. The insulating layer 5 can be formed by using a known technique such as sputtering, chemical vapor deposition (CVD), or the like. In addition, the material for forming the insulating layer 5 is not limited to an inorganic material and, for example, an organic material such as an acrylic resin, a polyimide resin, or the like may be used.

The display device 10 may include a protective layer 6 on the upper electrode 4. The protective layer 6 can be arranged so as to cover the pixels 100, 200, and 300. The protective layer 6 has a light transmitting property, and may include an inorganic material which has a low transmitting property with respect to oxygen or moisture from the outside. The protective layer 6 can be made of, for example, SiN, SiON, SiO, aluminum oxide ($Al_2O_3$), titanium oxide ($TiO_2$), or the like. The protective layer 6 can be formed by sputtering, CVD, atomic layer deposition (ALD), or the like. As long as it has a sufficient oxygen and moisture shielding performance, the protective layer 6 can have a single layer structure or may have a stacked layer structure including the above-described materials. Furthermore, the protective layer 6 may have a stacked layer structure formed by stacking the above-described inorganic material and an organic material. A known organic compound (resin/polymer compound) can be used as the organic material. The upper surface of the protective layer 6 may include a three-dimensional pattern conforming to the shape of the structure of the insulating layers 5 and below formed before the protective layer 6. The protective layer 6 can also be called a sealing layer. Even in a case in which the protective layer 6 is called a sealing layer, the performance of sealing the space between the protective layer 6 and the substrate 1 need not be perfect. That is, it is sufficient as long as the space between the protective layer 6 and the substrate 1 is sealed by including the components to be arranged above the protective layer 6.

The display device 10 may also include a planarization layer 7 between the protective layer 6 and a color filter layer CFL on which the color filters 102, 202, and 302 are arranged. The planarization layer 7 is made of a material having a light transmitting property. The planarization layer 7 can be made of any of an organic material and an inorganic material. Since the three-dimensional shape of the upper surface (a surface on a side opposite to the protective layer 6) of the planarization layer 7 can become smaller than that of the protective layer 6 in a case in which a resin material is used to form the planarization layer 7, the scattered light generated by the three-dimensional pattern of the upper surface of the protective layer 6 can be reduced. The planarization layer 7 can also be called a coat layer. An organic material, for example, an acrylic resin, an epoxy resin, a silicone resin, or the like can also be used for the planarization layer 7. The planarization layer 7 can be formed by a known method such as coating, polymerization vapor deposition, or the like.

The color filter layer CFL may also be directly formed on the protective layer 6 or the planarization layer 7. Alternatively, for example, the display device 10 including the color filter layer CFL can be formed by bonding a counter substrate on which the color filter layer CFL is formed and the substrate 1 on which the pixels 100, 200, and 300 are formed. In a case in which the counter substrate on which the color filter layer CFL is formed and the substrate 1 on which the pixels 100, 200, and 300 are to be bonded, bonding may be performed by sandwiching a resin in between them so that a gap will not occur between the color filter layer CFL and the protective layer 6 or the planarization layer 7. The color filter layer CFL may be formed by using any method, but mixing of colors between the pixels 100, 200, and 300 can be suppressed more easily by forming the color filter layer CFL near the light emitting regions 101, 201, and 301. The color filter layer CFL can be formed near the light emitting regions 101, 201, and 301 more easily by forming the color filter layer CFL directly on the protective layer 6 or the planarization layer 7.

The color filter layer CFL can be formed by coating a color resist on an underlayer such as the protective layer 6 or the planarization layer 7 for each of the color filters 102, 202, and 302, and performing patterning by using a lithography process. A color resist is made of, for example, a photocuring resin, and the pattern of each of the color filters 102, 202, and 302 can be formed by curing each portion which has been irradiated with ultraviolet light or the like.

Figure 6:
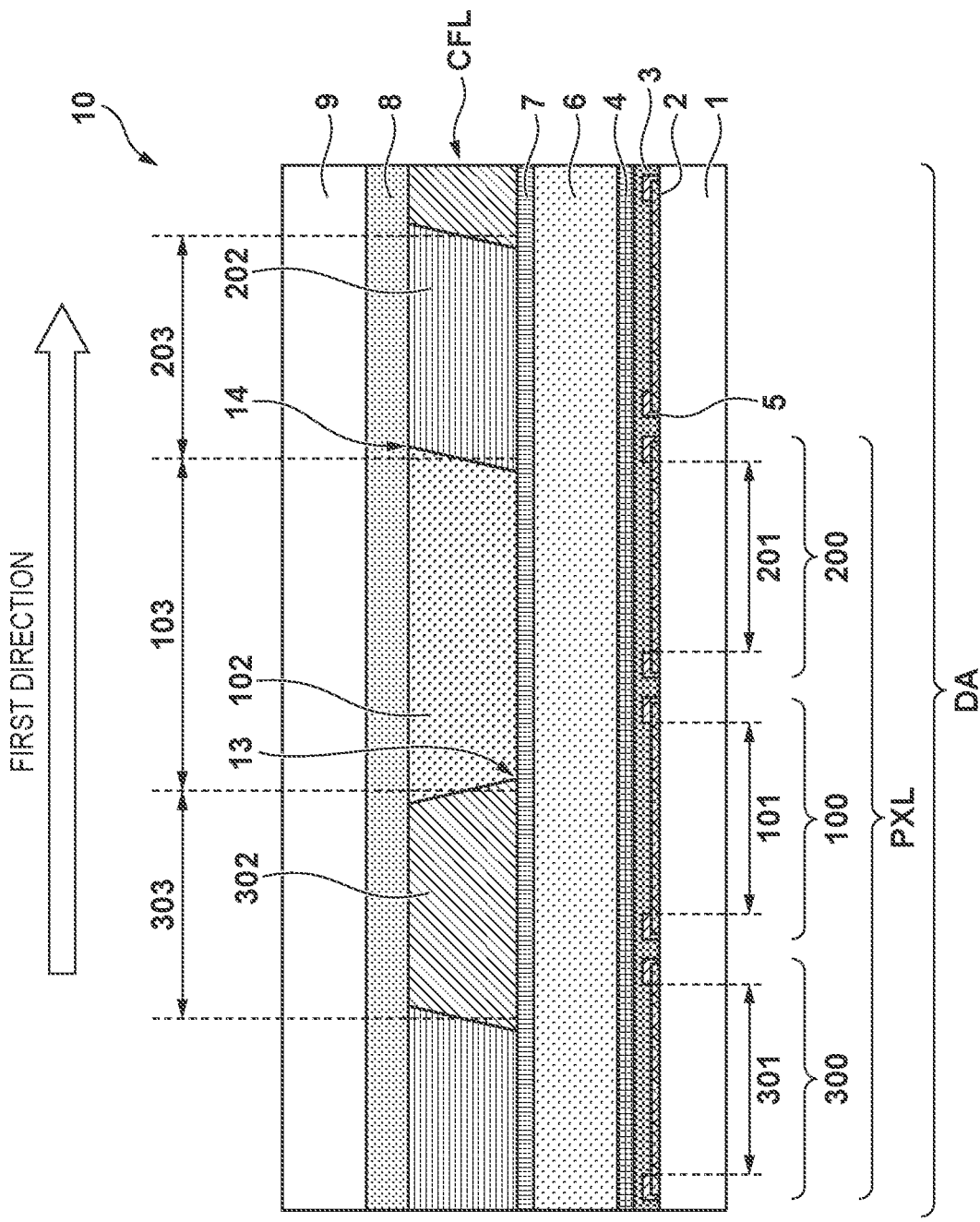
FIG. 6 is a view showing the outline of a modification of the display device of FIG. 1.
Figure 7:
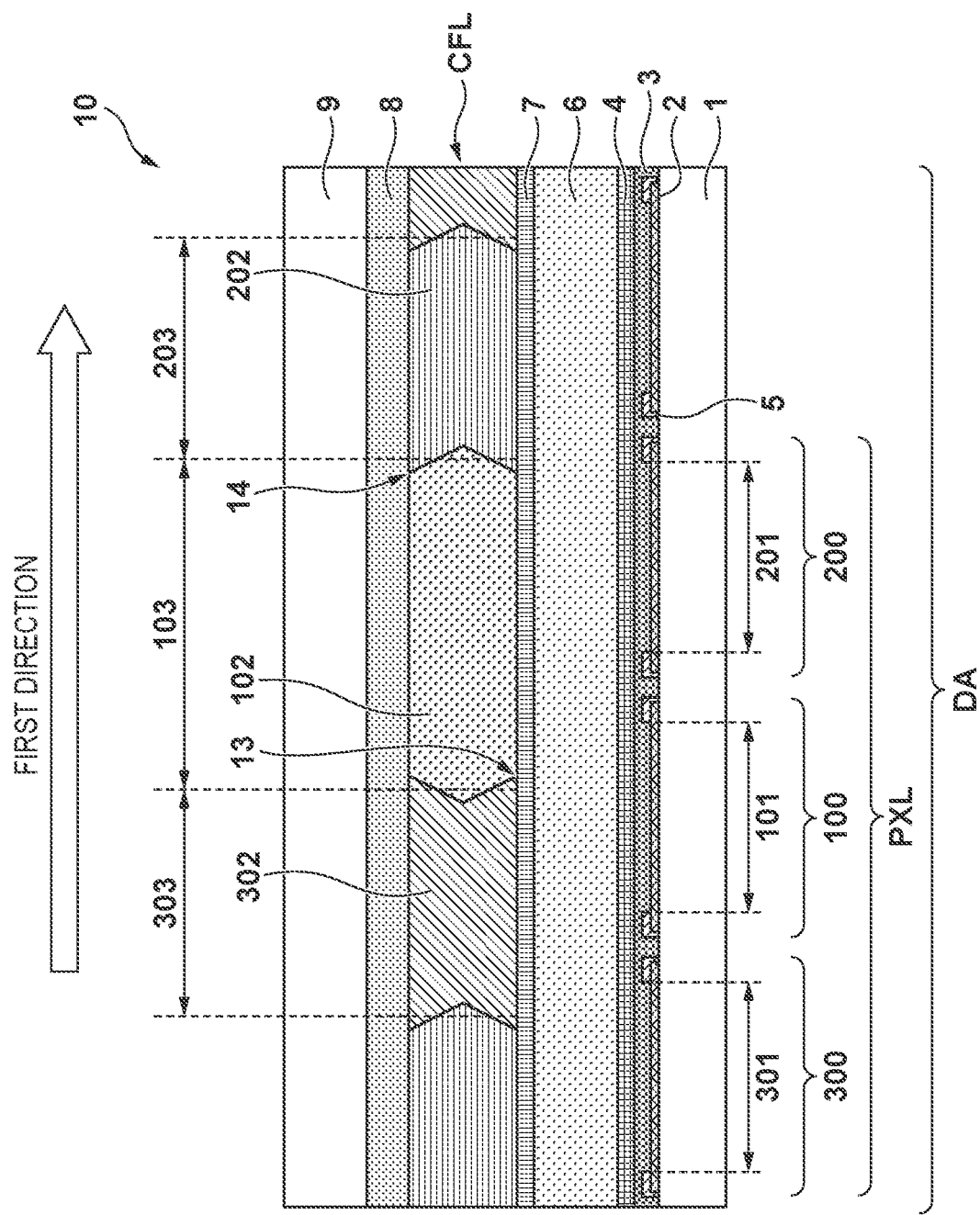
FIG. 7 is a view showing the outline of another modification of the display device of FIG. 1.

The sectional shapes of the ends of the color filters 102, 202, and 302 are not particularly limited. For example, as shown in FIG. 1, each of the ends of the color filters 102, 202, and 302 may be formed along the normal direction of the display surface of the display region DA. Alternatively, as shown in FIG. 6, for example, each of the ends of the color filters 102, 202, and 302 may have a tapered shape or an inverted tapered shape. That is, the shape of each of the color filters 102, 202, and 302 may be a parallelogram or a trapezoid in the section along the first direction. In addition, for example, as shown in FIG. 7, each of the color filters 102, 202, and 302 may have a convex shape or a concave shape in the direction of the color filter adjacent to the vicinity of the middle of the thickness direction in the section along the first direction. As previously described, in a case in which the boundary of two adjacent color filters is tilted with respect to the normal direction of the display surface of the display region DA, the portion where the thicknesses of the adjacent color filters are the same can be regarded as the end of each of these color filters.

In addition, to suppress leaking of light in the boundary portion of each of the color filters 102, 202, and 302 of the color filter layer CFL, the ends of the color filter may be arranged to overlap the color filters of adjacent pixels.

Figure 8:
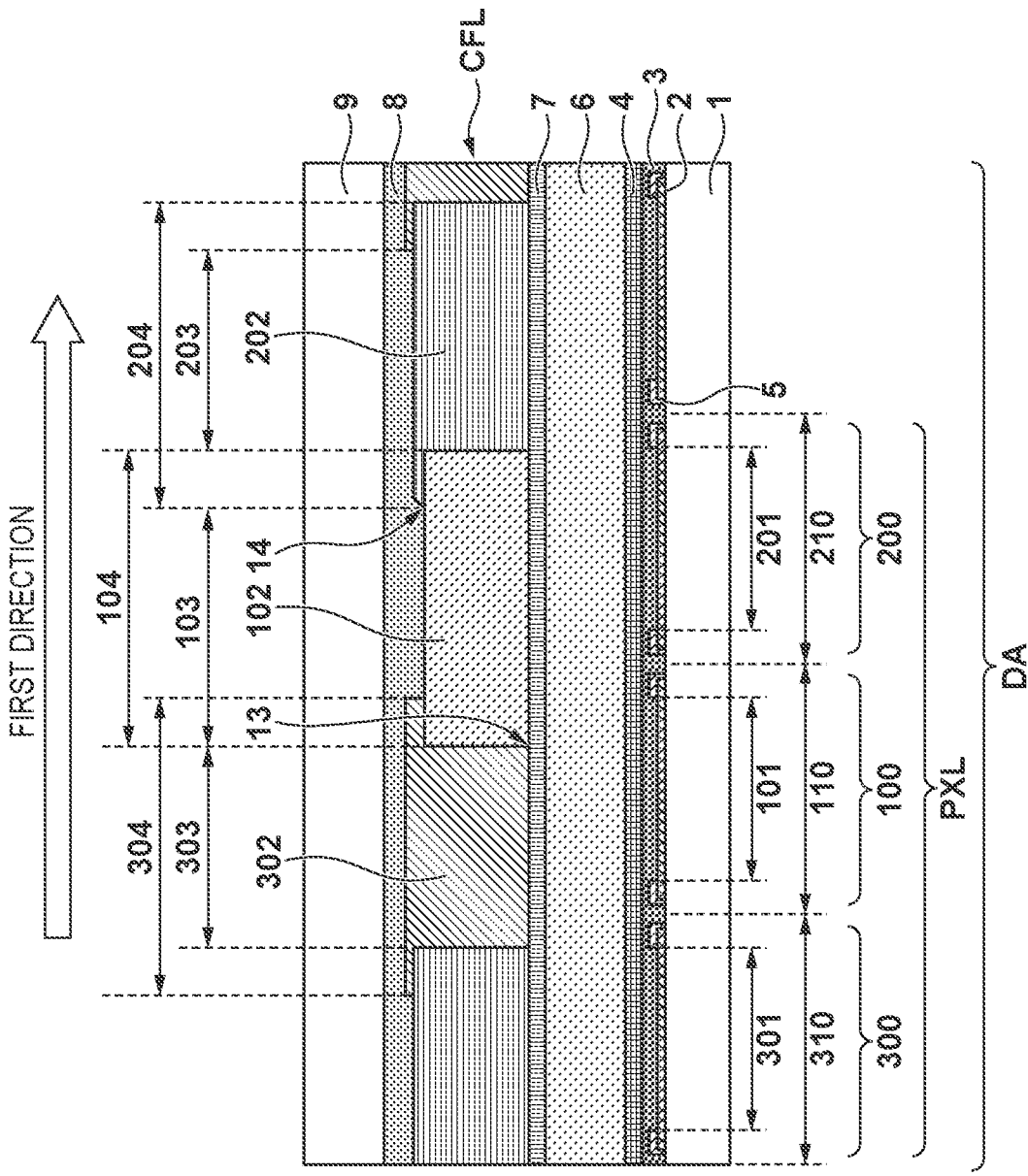
FIG. 8 is a view showing the outline of still another modification of the display device of FIG. 1.

FIG. 8 shows a case in which the ends of the color filters 102, 202, and 302 overlap in the display device 10. As shown in FIG. 8, in a case in which the color filter layer CFL is to be formed on the protective layer 6 or the planarization layer 7, the color filter 102 may be formed below the color filters 202 and 302. For example, the color filters 202 and 302 may be formed after the color filter 102 is formed. In this case, a formation width 104 of the color filter 102, a formation width 204 of the color filter 202, and a formation width 304 of the color filter 302 which are parallel to the first direction may be the same width (length). The formation width 104 of the color filter 102, the formation width 204 of the color filter 202, and the formation width 304 of the color filter 302 which are parallel to the first direction are formed to be larger than a width 110 of the pixel 100, a width 210 of the pixel 200, and a width 310 of the pixel 300, respectively, which are parallel to the first direction. In this case, as shown in FIG. 8, the width 110 of the pixel 100 can be defined by a width between the midpoints of the respective light emitting regions 201 and 301 adjacent to the light emitting region 101. In a similar manner, the width 210 of the pixel 200 and the width 310 of the pixel 300 can be defined by a width between the midpoints of respective light emitting regions adjacent to the corresponding light emitting regions 201 and 301.

In this manner, by forming the color filter 102 before the color filter 202 and the color filter 302 and setting the formation width 104 of the color filter 102, the formation width 204 of the color filter 202, and the formation width 304 of the color filter 302 to be the same in a state parallel to the first direction, the length 103 parallel to the first direction of the color filter 102 can be made longer than the length 203 parallel to the first direction of the color filter 202 and the length 303 parallel to the first direction of the color filter 302. In addition, an effect of suppressing leaking of light in the boundary portions between the color filter 102 and the color filters 202 and 302 can be obtained.

As shown in FIG. 8, the ends of both of the color filters 202 and 302 of the pixels 200 and 300, respectively, may be arranged to overlap the corresponding ends of the color filter 102 of the pixel 100. As shown in FIG. 1, the light L is emitted tilted in the first direction with respect to the normal direction of the display surface. Hence, if the thickness of the portion, which is arranged on the color filter 102, of the color filter 202 increases, the light L that passes near the end 14 of the color filter 102 will enter and be absorbed in the portion of the color filter 202 overlapping the color filter 102 more easily. To avoid such a state, the thickness of the portion, which is arranged on the color filter 102 of the pixel 100, of the color filter 202 of the pixel 200 may be made thinner than the thickness of the portion, which is arranged on the color filter 102 of the pixel 100, of the color filter 302 of the pixel 300.

In addition, the present invention is not limited to an arrangement in which the ends of both of the color filters 202 and 302 of the pixels 200 and 300, respectively, are arranged to overlap the corresponding ends of the color filter 102 of the pixel 100. It may be arranged so that the end of at least one of the color filters 202 and 302 of the pixels 200 and 300, respectively, will overlap the corresponding end of the color filter 102 of the pixel 100.

In addition, the end of the color filter 202 of the pixel 200 may be arranged to overlap the corresponding end of the color filter 102 of the pixel 100, and the end, which is arranged on the color filter 102 of the pixel 100, of the color filter 202 of the pixel 200 may have a tapered shape. This will reduce the possibility that the light L which passes near the end 14 in the first direction of the upper surface of the color filter 102 of the pixel 100 will be absorbed more by the end of the color filter 202 than in a case in which the end of the color filter 202 of the pixel 200 does not have a tapered shape. The light L is emitted tilted in the first direction with respect to the normal direction of the display surface. Hence, in a case in which not only the end of the color filter 202 overlaps the color filter 102, but also each adjacent color filter overlaps the end in the first direction of the corresponding color filter, this effect of suppressing the absorption of light can be obtained if the end of each overlapping color filter has a tapered shape.

In addition, for example, it may be arranged so that the end of the color filter 302 of the pixel 300 will overlap the end of the color filter 102 of the pixel 100 and the end, which is arranged on the color filter 102 of the pixel 100, of the color filter 302 of the pixel 300 will have a tapered shaped. In a case in which two adjacent color filters are to overlap, an appropriate shape can be selected for the shape of the end of the overlapping color filter.

A filling layer 8 may be arranged on the color filter layer CFL. The filling layer 8 has a light transmitting property, and may be made of, for example, an organic material such as an acrylic resin, an epoxy resin, a silicone resin, or the like. A surface (an upper surface of the filling layer 8) on the light emitting side of the filling layer 8 may be flatter than the upper surface of the color filter layer CFL. Also, a planarization layer may further be arranged between the color filter layer CFL and the filling layer 8. The planarization layer arranged between the color filter layer CFL and the filling layer 8 may be made of the same material as the planarization layer 7 arranged between the protective layer 6 and the color filter layer CFL described above. The planarization layer arranged between the color filter layer CFL and the filling layer 8 may contact the planarization layer 7 outside the display region DA, that is, at the end of the display device 10. If the planarization layer arranged between the color filter layer CFL and the filling layer 8 is made of the same material as the planarization layer 7 arranged between the protective layer 6 and the color filter layer CFL, high adhesiveness can be obtained between these layers.

A counter substrate 9 can be arranged on the filling layer 8. The counter substrate 9 is made of a light transmitting material. The counter substrate 9 can be made of, for example, glass, plastic, or the like, and the upper surface of the counter substrate 9 through which light is emitted can be flat.

Figure 9:
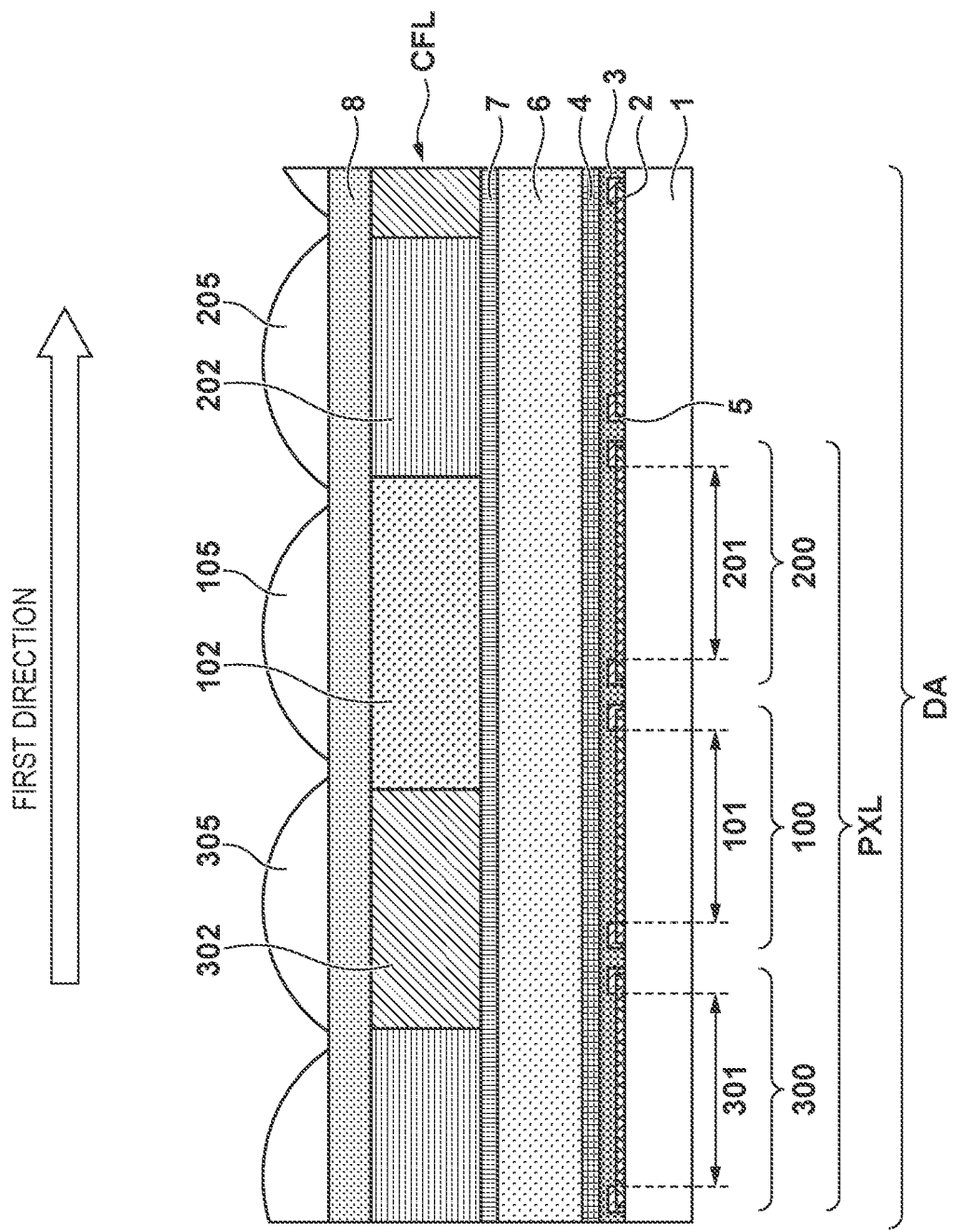
FIG. 9 is a view showing an example of the arrangement of microlenses in the display device of FIG. 1.
Figure 10:
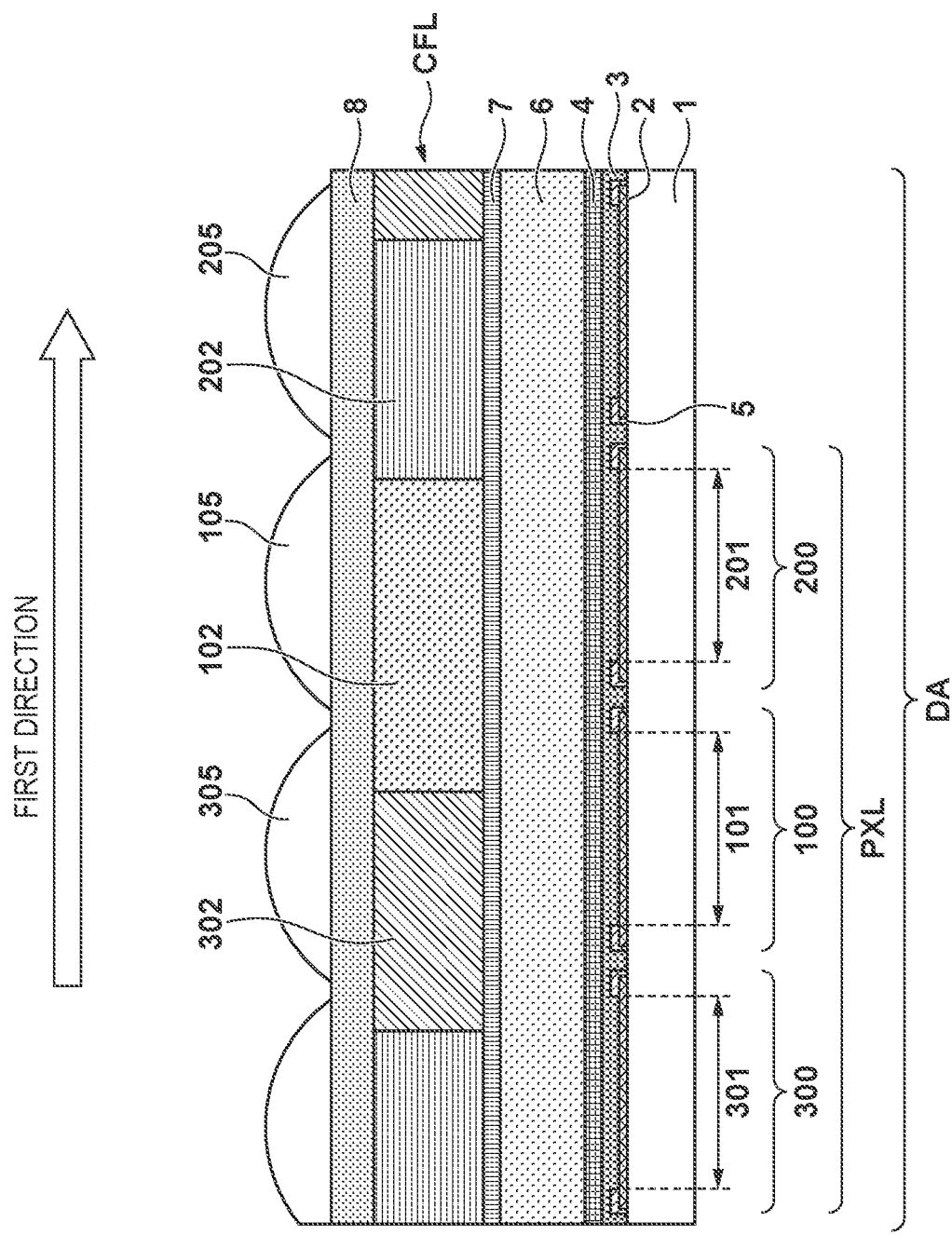
FIG. 10 is a view showing another example of the arrangement of the microlenses in the display device of FIG. 1.
Figure 11:
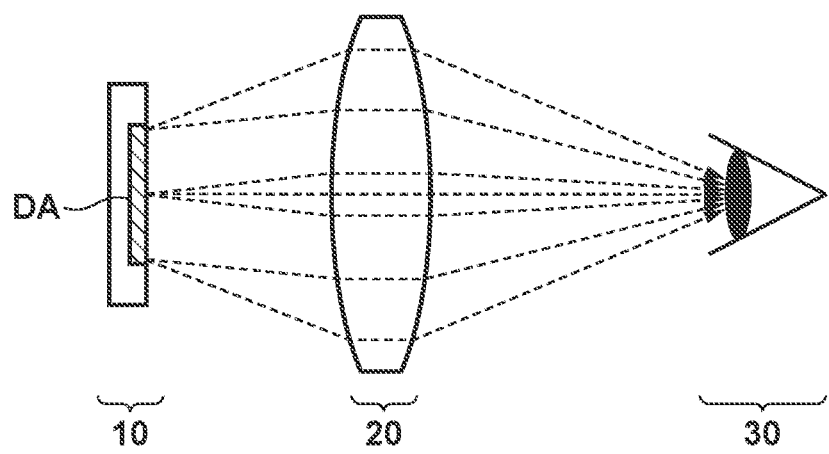
FIG. 11 is a schematic view showing the relationship between an observer and the display device via a magnification optical system.

To improve the light emission efficiency, microlenses 105, 205, and 305 may be arranged on the light emitting side of the color filter layer CFL, that is, on the color filters 102, 202, and 302 of the pixels 100, 200, and 300, respectively. That is, each of the plurality of pixels arranged on the display region DA of the display device 10 may further include a microlens arranged on the color filter. The microlenses 105, 205, and 305 may be formed on the filling layer 8 as shown in FIGS. 9 and 10. Also, although not shown in FIGS. 9 and 10, the counter substrate 9 may be arranged on the microlenses 105, 205, and 305. In this case, there may be a space between the counter substrate 9 and the microlenses 105, 205, and 305. The space may be filled with various kinds of materials or may be an air gap.

More specifically, the microlenses 105, 205, and 305 have a light transmitting property, and can be made of, for example, an organic material such as an acrylic resin, an epoxy resin, a silicone resin, or the like or an inorganic material such as SiN, SiON, SiO, or the like. The shape of each of the microlenses 105, 205, and 305 may be a convex shape or a concave shape. If the shape is a convex shape, a material with a lower refractive index than that of the material forming the microlenses 105, 205, and 305 will be arranged on the light emitting side of the microlenses 105, 205, and 305. A material with a low refractive index, for example, a gas such as air or nitrogen, silica aerogel, or the like can be arranged on the light emitting side of the microlenses 105, 205, and 305. Also, for example, the light emitting side of the microlenses 105, 205, and 305 may be in a vacuum state. In a case in which the microlenses 105, 205, and 305 having a convex shape are to be made of a material with high refractive index such as SiN or the like, the light emitting side of the microlenses 105, 205, and 305 can be made of a material with comparatively low refractive index, for example, an organic material such as an acrylic resin, an epoxy resin, or a silicone resin or an inorganic material such as SiO. In a case in which the microlenses 105, 205, and 305 have a concave shape, a material with a refractive index higher than that of the material forming the microlenses 105, 205, and 305 can be arranged on the light emitting side. The shape of each of the microlenses 105, 205, and 305 is not particularly limited. The shape of each of the microlenses 105, 205, and 305 may be a spherical shape or an aspherical shape.

As shown in FIG. 9, the microlenses 105, 205, and 305 of the pixels 100, 200, and 300, respectively, may be arranged so that the center position of each microlens will match the center position of the corresponding one of the color filters 102, 202, and 302, which correspond to the pixels 100, 200, and 300, respectively, in an orthogonal projection with respect to the display region DA. In addition, in a case in which a wide viewing angle is required, the microlenses 105, 205, and 305 of the pixels 100, 200, and 300, respectively, may be arranged so that the center position of each microlens will be shifted closer to the first direction than the center position of the corresponding one of the color filters 102, 202, and 302, which correspond to the pixels 100, 200, and 300, respectively, in an orthogonal projection with respect to the display region DA as shown in FIG. 10. The distribution of shift amounts between the microlenses 105, 205, and 305 and the color filters 102, 202, and 302 in the display region DA can be set appropriately. In a similar manner to the above-described relationship between the color filters 102, 202, and 302 and the light emitting regions 101, 201, and 301, the shift amounts between the microlenses 105, 205, and 305 and the color filters 102, 202, and 302, respectively, from the middle region DC to the peripheral regions DL and DR of the display region DA can be increased continuously or stepwise. As a method of continuously changing each shift amount, the pitch at which each of the microlenses 105, 205, and 305 is arranged may be set larger than the pitch at which each of the light emitting regions 101, 201, and 301 is arranged in the entire surface of the display region DA in a manner similar to the above-described relationship between the color filters 102, 202, and 302 and the light emitting regions 101, 201, and 301.

In addition, a pixel array including the pixels 100, 200, and 300 when the microlenses 105, 205, and 305 are to be arranged can be compatible with any kind of pixel array such as a Bayer array, a stripe array, a delta array, or the like described above. For example, using the delta array shown in FIG. 2C will allow the circular shaped microlenses 105, 205, and 305 to be arranged easily in the display region DA.

Application examples in which the display device 10 according to this embodiment has been applied to a photoelectric conversion device, an electronic device, an illumination device, a moving body, and a wearable device will be described with reference to FIGS. 15 to 21A and 21B. In addition, the display device 10 can be used as an exposure light source of an electrophotographic image forming device, the backlight of a liquid crystal display device, a light emitting device including a color filter in a white light source, and the like. The display device 10 may be an image information processing device that includes an image input unit for inputting image information from an area CCD, a linear CCD, a memory card, or the like, and an information processor for processing the input information, and displays the input image on a display unit. In addition, a display unit included in a camera or an inkjet printer may have a touch panel function. The driving type of the touch panel function may be an infrared type, a capacitance type, a resistive film type, or an electromagnetic induction type, and is not particularly limited. The display device may be used for the display unit of a multifunction printer.

Figure 15:
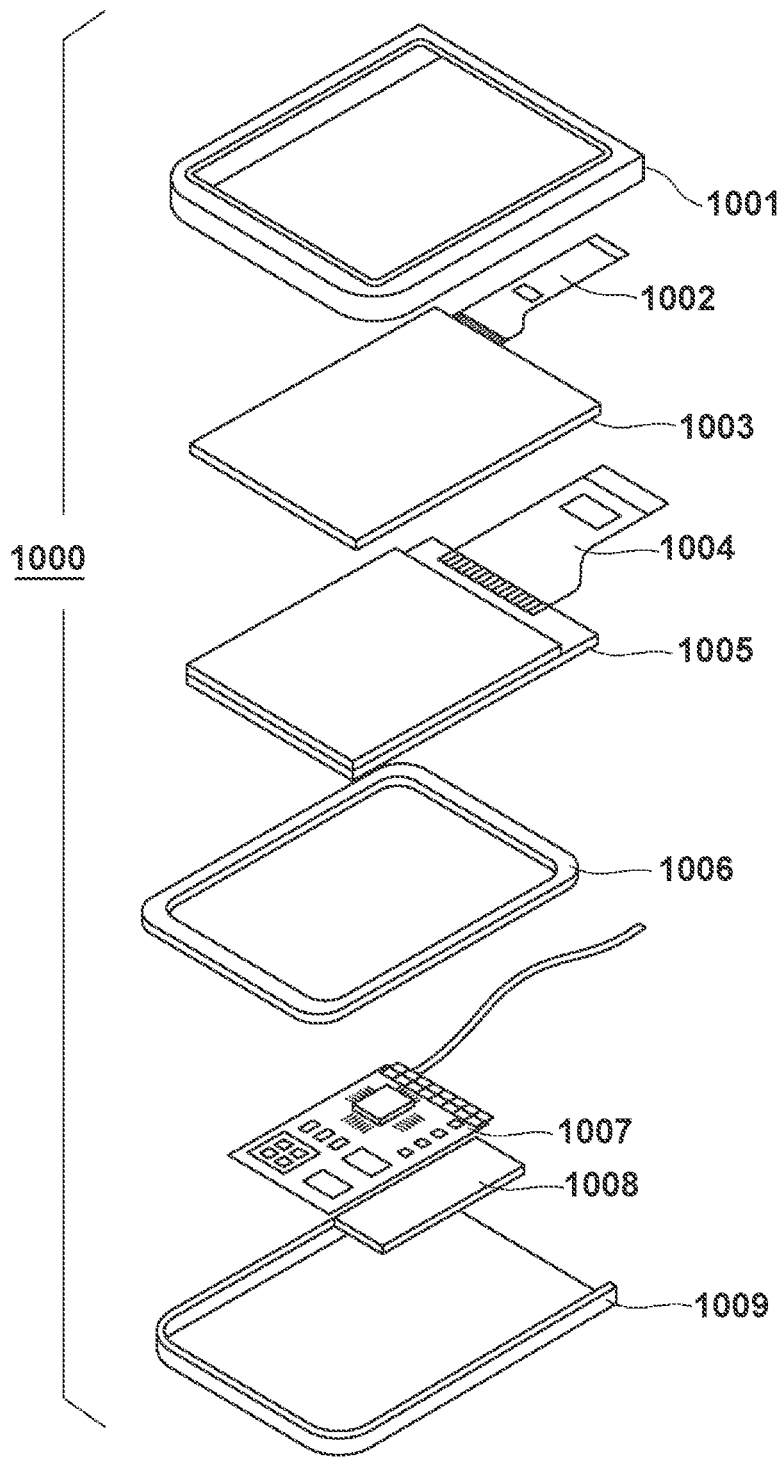
FIG. 15 is a view showing an application example of the display device of FIG. 1.

FIG. 15 is a schematic view showing a display device 1000 as an application example of the display device 10 according to this embodiment. The display device 1000 shown in FIG. 15 can include a touch panel 1003, a display panel 1005, a frame 1006, a circuit board 1007, and a battery 1008 between an upper cover 1001 and a lower cover 1009. When an image is to be displayed on the display panel 1005 of the display device 1000, image display may be performed by switching the display mode in the above-described manner in accordance with the image quality of the image to be displayed or the like. Flexible printed circuits (FPCs) 1002 and 1004 are respectively connected to the touch panel 1003 and the display panel 1005. Active elements such as transistors are arranged on the circuit board 1007. The battery 1008 is unnecessary if the display device 1000 is not a portable device. Even if the display device 1000 is a portable device, the battery 1008 need not be provided in this position.

The display device 1000 shown in FIG. 15 may also be used as a display unit of a photoelectric conversion device (image capturing device) including an optical unit having a plurality of lenses, and an image capturing element for receiving light having passed through the optical unit and photoelectrically converting the light into an electrical signal. The photoelectric conversion device can include a display unit for displaying information acquired by the image capturing element. In addition, the display unit may be a display unit exposed outside the photoelectric conversion device or a display unit arranged in the viewfinder. The photoelectric conversion device may also be a digital camera or a digital video camera.

Figure 16:
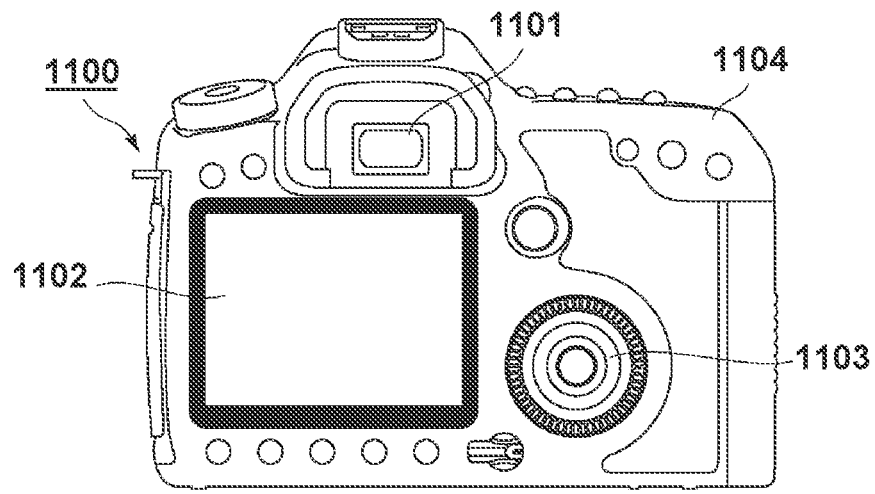
FIG. 16 is a view showing an example of a photoelectric conversion device using the display device of FIG. 1.

FIG. 16 is a schematic view showing an example of the photoelectric conversion device using the display device 10 according to this embodiment. A photoelectric conversion device 1100 can include a viewfinder 1101, a rear display 1102, an operation unit 1103, and a housing 1104. The photoelectric conversion device 1100 can also be referred to as an image capturing device. The above-described display device 10 is applicable to the viewfinder 1101 as a display unit. The above-described display device 10 may also be applied to the rear display 1102. In these cases, the display device 10 can display not only an image to be captured but also environment information, image capturing instructions, and the like. Examples of the environment information are the intensity and direction of external light, the moving velocity of an object, and the possibility that an object is shielded by a shielding object.

The timing suitable for image capturing is often a very short time, so the information is preferably displayed as quickly as possible. Accordingly, the above-described display device 10 which contains an organic light emitting material such as an organic EL element as a light emitting element can be used as the viewfinder 1101. This is because the organic light emitting material has a high response speed. For these devices that require display speed, the display device 10 using the organic light emitting material can be used more suitably than a liquid crystal display device.

The photoelectric conversion device 1100 includes an optical unit (not shown). This optical unit has a plurality of lenses, and forms an image of light having passed through the optical unit on a photoelectric conversion element (not shown) that is accommodated in the housing 1104 and receives the light. The focal points of the plurality of lenses can be adjusted by adjusting the relative positions. This operation can also be automatically performed.

The display device 10 may be applied to the display unit of the electronic device. At this time, the display device 10 can have both a display function and an operation function.

Examples of the portable terminal are a portable phone such as a smartphone, a tablet, and a head mounted display.

Figure 17:
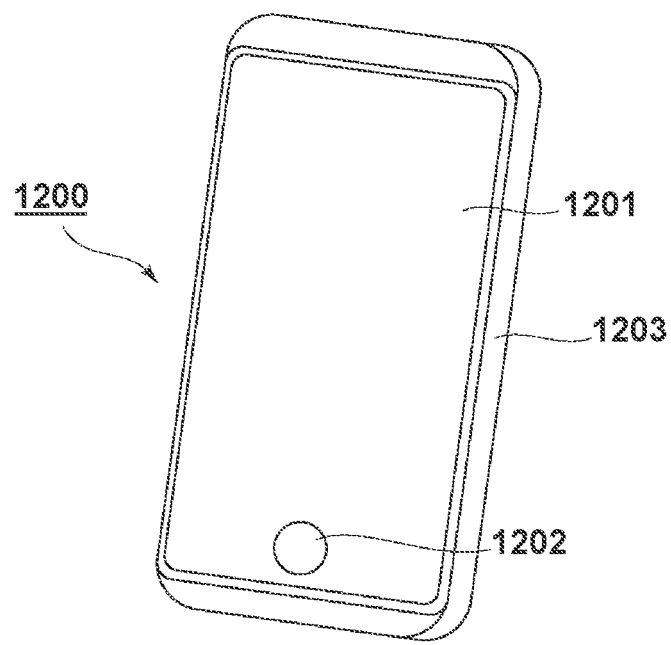
FIG. 17 is a view showing an example of an electronic device using the display device of FIG. 1.

FIG. 17 is a schematic view showing an example of the electronic device using the display device 10 according to this embodiment. An electronic device 1200 includes a display unit 1201, an operation unit 1202, and a housing 1203. The housing 1203 can accommodate a circuit, a printed board having this circuit, a battery, and a communication unit. The operation unit 1202 may be a button or a touch-panel-type reaction unit. The operation unit 1202 can also be a biometric authentication unit that performs unlocking or the like by authenticating the fingerprint. A portable device including a communication unit can also be regarded as a communication device. The above-described display device 10 is applicable to the display unit 1201.

Figure 18A:
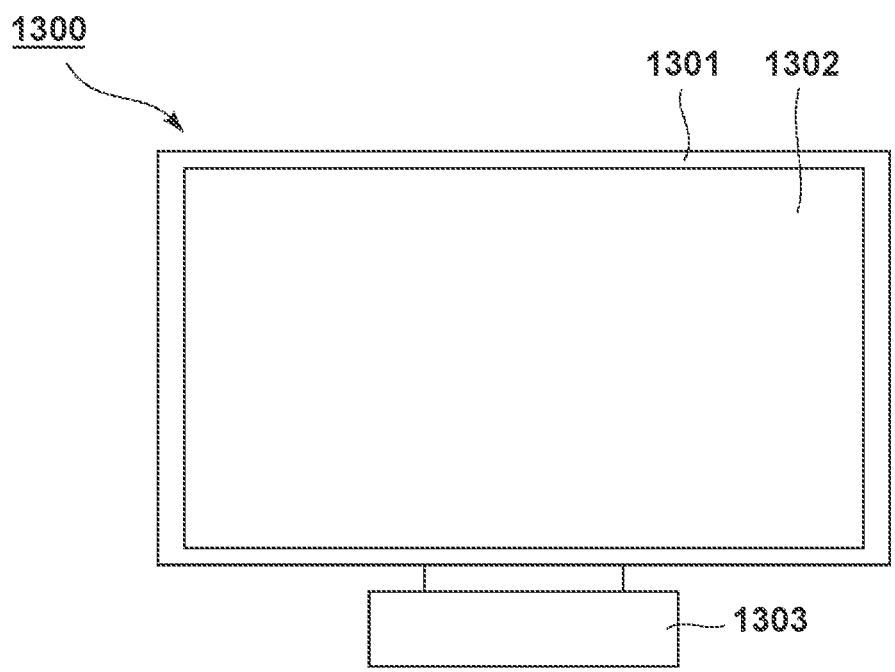
FIGS. 18A and 18B are views each showing an example of a display device using the display device of FIG. 1.

FIG. 18A is a schematic view showing a display device 1300 as a further application example using the display device 10 according to this embodiment. The display device 1300 of FIG. 18A is a display device such as a television monitor or a PC monitor. The display device 1300 includes a frame 1301 and a display unit 1302. When an image is to be displayed on the display unit 1302 of the display device 1300, image display may be performed by switching the display mode in the above-described manner in accordance with the image quality of the image to be displayed or the like. The display device 1300 may also include a base 1303 that supports the frame 1301 and the display unit 1302. The base 1303 is not limited to the form shown in FIG. 18A. For example, the lower side of the frame 1301 may also function as the base 1303. In addition, the frame 1301 and the display unit 1302 may be bent. The radius of curvature in this case can be 5,000 mm or more to 6,000 mm or less. When an image is to be displayed on the display unit 1302 of the display device 1300, image display may be performed by switching the display mode in the above-described manner in accordance with the image quality of the image to be displayed or the like.

Figure 18B:
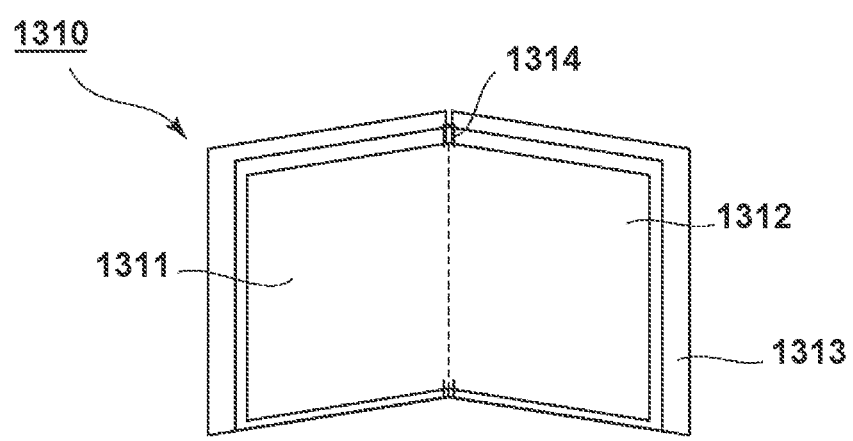

FIG. 18B is a schematic view showing a display device 1310 as another application example using the display device 10 according to this embodiment. The display device 1310 shown in FIG. 18B can be folded, that is, the display device 1310 is a so-called foldable display device. The display device 1310 includes a first display unit 1311, a second display unit 1312, a housing 1313, and a bending point 1314. When an image is to be displayed on the first display unit 1311 or the second display unit 1312 of the display device 1310, image display may be performed by switching the display mode in the above-described manner in accordance with the image quality of the image to be displayed or the like. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 19:
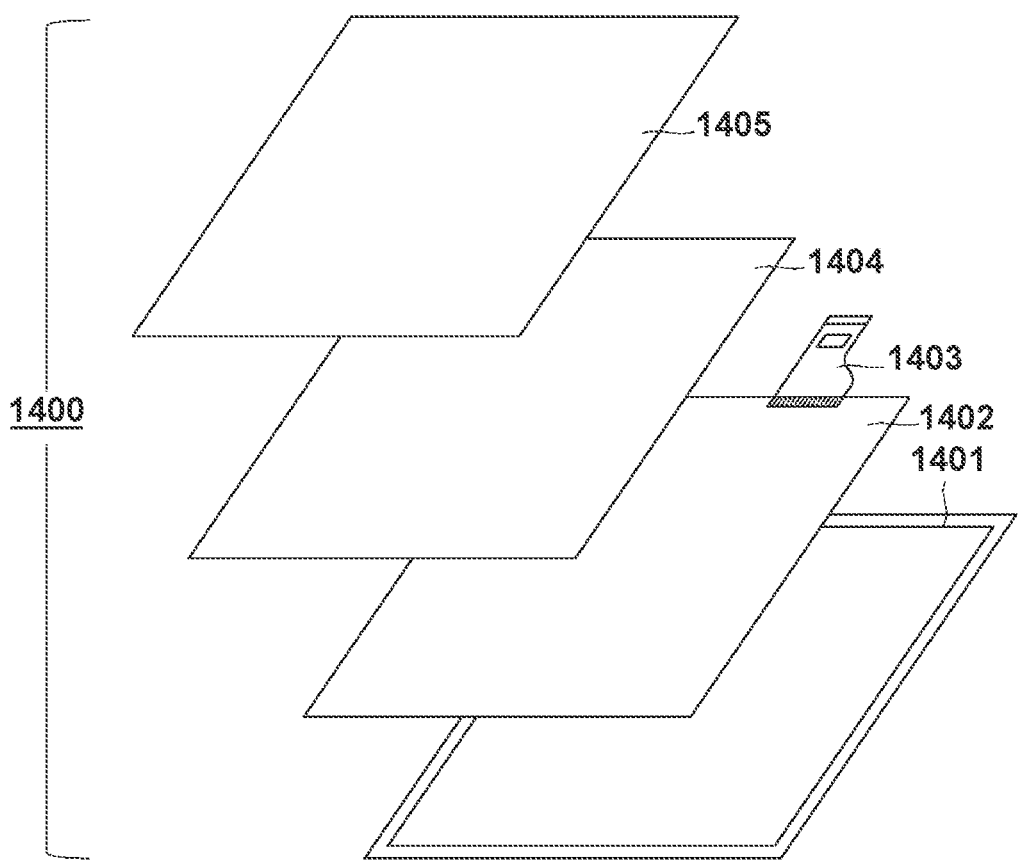
FIG. 19 is a view showing an example of an illumination device using the display device of FIG. 1.

FIG. 19 is a schematic view showing an example of the illumination device using the display device 10 according to this embodiment. An illumination device 1400 can include a housing 1401, a light source 1402, a circuit board 1403, an optical film 1404, and a light diffusing unit 1405. The above-described display device 10 is applicable to the light source 1402. The optical film 1404 can be a filter that improves the color rendering of the light source. During illumination or the like, the light diffusing unit 1405 can cast the light of the light source over a broad range by effectively diffusing the light. The illumination device 1400 can also include a cover on the outermost portion, as needed. The illumination device 1400 may include both the optical film 1404 and the light diffusing unit 1405 or include only one of them.

The illumination device 1400 is, for example, a device for illuminating the room or the like. The illumination device 1400 can emit white light, natural white light, or light of any color from blue to red. The illumination device 1400 can also include a light control circuit for controlling light. The illumination device 1400 can also include a power supply circuit to be connected to the display device 10 that functions as the light source 1402. This power supply circuit can be a circuit for converting an AC voltage into a DC voltage. "White" has a color temperature of 4,200 K, and "natural white" has a color temperature of 5,000 K. The illumination device 1400 may also have a color filter. In addition, the illumination device 1400 can have a heat radiation unit. The heat radiation unit radiates the internal heat of the device to the outside of the device, and examples are a metal having a high specific heat and liquid silicon.

Figure 20:
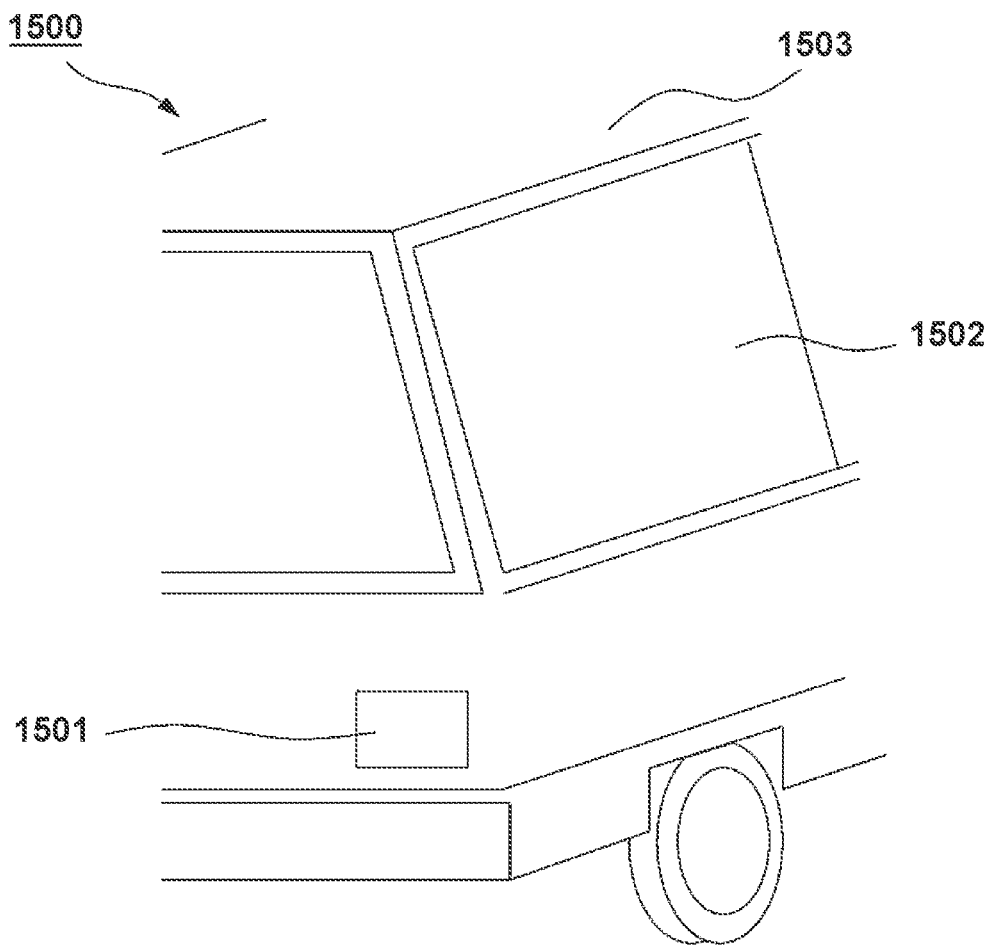
FIG. 20 is a view showing an example of a moving body using the display device of FIG. 1.

FIG. 20 is a schematic view of an automobile including a taillight as an example of a vehicle lighting appliance using the display device 10 according to this embodiment. An automobile 1500 has a taillight 1501, and the taillight 1501 may be turned on when performing a braking operation or the like. The display device 10 according to this embodiment may be used as a headlight serving as a vehicle lighting appliance. The automobile is an example of a moving body, and the moving body may be a ship, a drone, an airplane, a railway vehicle, an industrial robot such as an automated guided vehicle (AGV), or the like. The moving body can include a main body and a lighting appliance installed in the main body. The lighting appliance may also be a device that sends a notification of the current position of the main body.

The above-described display device 10 is applicable to the taillight 1501. The taillight 1501 can have a protection member for protecting the display device 10 that functions as the taillight 1501. The material of the protection member is not limited as long as the material is a transparent material with a strength that is high to some extent, and can be polycarbonate. The protection member can also be formed by mixing a furandicarboxylic acid derivative or an acrylonitrile derivative in polycarbonate.

The automobile 1500 can include a body 1503, and a window 1502 attached to the body 1503. This window can be a window for checking the front and back of the automobile, and can also be a transparent display. The above-described display device 10 can be used as this transparent display. In this case, the constituent materials such as the electrodes of the display device 10 are formed by transparent members. The display device 10 may be used as an instrument panel, an image display unit of a car navigation system, and the like of the automobile 1500.

Further application examples of the display device 10 according to each above-described embodiment will be described with reference to FIGS. 21A and 21B. The display device 10 is applicable to, for example, a system that can be worn as a wearable device such as smart glasses, an HMD, smart contact lenses, or the like. The display device 10 that can be used in such an application example can include an image capturing device which can photoelectrically convert visible light and the display device 10 which can emit visible light.

Figure 21A:
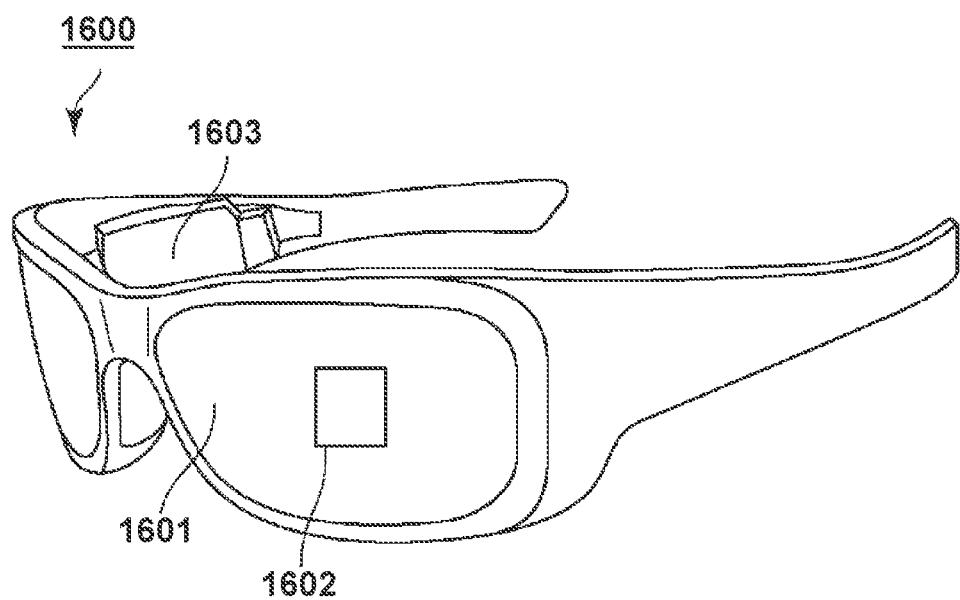
FIGS. 21A and 21B are views each showing an example of a wearable device using the display device of FIG. 1.

FIG. 21A illustrates a pair of glasses 1600 (smart glasses) according to an application example. An image capturing device 1602 such as a CMOS sensor or an SPAD is arranged on the front surface side of a lens 1601 of the glasses 1600.

Also, the display device 10 according to the embodiments described above is arranged on the back surface side of the lens 1601.

The pair of glasses 1600 further includes a control device 1603. The control device 1603 functions as a power supply that supplies power to the image capturing device 1602 and the display device 10 according to each embodiment. The control device 1603 also controls the operation of the image capturing device 1602 and the operation of the display device. An optical system for focusing light to the image capturing device 1602 is formed on the lens 1601.

Figure 21B:
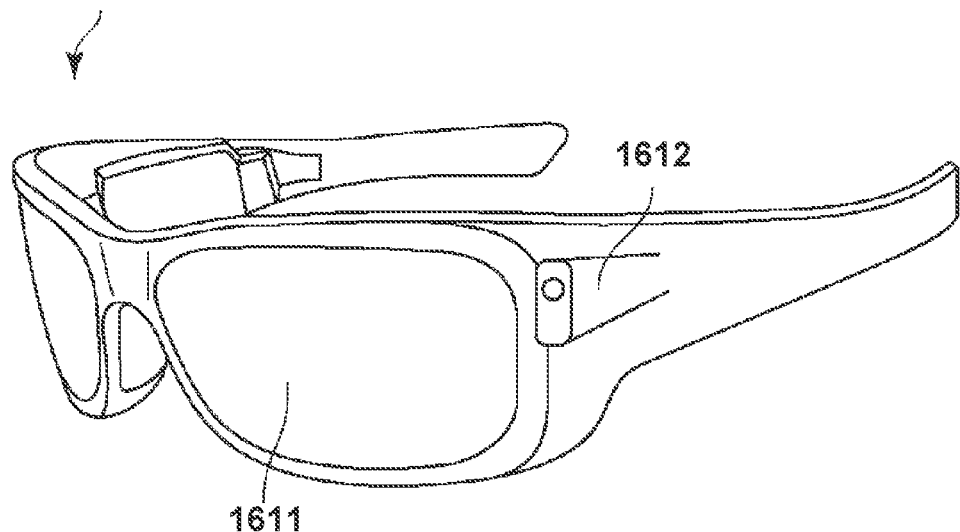

FIG. 21B illustrates a pair of glasses 1610 (smart glasses) according to another application example. The pair of glasses 1610 includes a control device 1612, and an image capturing device corresponding to the image capturing device 1602 and the display device 10 are incorporated in the control device 1612. An image capturing device in the control device 1612 and an optical system for projecting light emitted from the display device 10 are formed on a lens 1611, and an image is projected to the lens 1611. In addition to functioning as a power supply that supplies power to the image capturing device and the display device, the control device 1612 also controls the operation of the image capturing device and the operation of the display device 10. The control device can also include a line-of-sight detection unit that detects the line of sight of a wearer of the smart glasses. Infrared light can be used for line-of-sight detection. An infrared light emitting unit emits infrared light to the eyeball of a user who is gazing at displayed image. The reflected light from the eyeball that is obtained when the infrared light is emitted is detected by an image capturing unit which includes a light receiving element, thereby obtaining a captured image of the eyeball. Image quality degradation is reduced by providing a reduction unit that reduces the light from the infrared light emitting unit to the display unit in a planar view.

The line of sight of the user to the displayed image is detected from the captured image of the eyeball obtained by the image capturing operation using the infrared light. A known method can be arbitrarily applied for the line-of-sight detection using the captured eyeball image. As an example, a line-of-sight detection method based on Purkinje images caused by the reflection of the emitted light on the cornea can be used.

More specifically, line-of-sight detection processing is performed based on a pupil-cornea reflection method. The line of sight of the user is detected by using the pupil-cornea reflection method to calculate a line-of-sight vector representing the direction (rotation angle) of the eyeball based on the image of the pupil and the Purkinje images included in the captured image of the eyeball.

The display device 10 according to one embodiment of the present invention can include an image capturing device including a light receiving element, and it can control a displayed image on the display device 10 based on the line-of-sight information of the user obtained from the image capturing apparatus.

More specifically, in the display device 10, a first field-of-view region which is gazed by the user and a second field-of-view region other than the first field-of-view region are determined based on the line-of-sight information. The first field-of-view region and the second field-of-view region may be determined by a control device provided in the display device 10 or may receive what a control device of an external unit has determined. Control can be performed in the display region of the display device 10 so that the display resolution of the first field-of-view region will be higher than the display resolution of the second field-of-view region. That is, the resolution of the second field-of-view region may be lowered more than the resolution of the first field-of-view region.

In addition, the display region includes a first display region and a display second region different from the first display region, and a region with a high degree of priority is determined from the first display region and the second display region based on the line-of-sight information. The first display region and the second display region may be determined by the control device of the display device 10. Alternatively, the first display region and the second display region may be determined by an external control device and the display device may receive information corresponding to this determination. Control may be performed so that the resolution of a region with the high degree of priority will be set higher than the resolution of a region other than the region with the high degree of priority. That is, the resolution of a region with a relatively low degree of priority can be set low.

Note that an AI can be used for the determination of the first field-of-view region and the region with the high degree of priority. The AI may be a model configured to estimate, from an image of the eyeball, the angle of the line of sight and the distance to an object as the target of the gaze by using the image of the eyeball and the direction actually gazed by the eyeball of the image as the training data. The display device, the image capturing device, or an external device may include the AI program. If the AI program is included in an external device, information will be transmitted to the display device 10 by communication.

In a case in which display control is to be performed based on visual recognition detection, application can be performed to a pair of smart glasses that further includes an image capturing device configured to capture the outside. The smart glasses can display the captured external information in real time.

Examples of this embodiment will be described hereinafter.

Example 1

The display device 10 that had the arrangement shown in FIGS. 3A to 3C and FIG. 4A was formed in the following manner. First, each lower electrode 2 was formed by depositing aluminum on the substrate 1 and performing patterning on the deposited aluminum. Next the insulating layer 5 was formed between the lower electrodes 2. Silicon oxide was used for the insulating layer 5. The layer thickness of the insulating layer 5 was set to 65 nm. To determine the light emitting regions 101, 201, and 301, an opening portion was provided in the insulating layer 5 on each of the lower electrodes 2. The pitch at which the light emitting region 101 was periodically arranged, the pitch at the light emitting region 201 was periodically arranged, and the pitch at which the light emitting region 301 was periodically arranged in the entire display region DA were each set to 7.8 μm. The display region DA was formed so that the size of the entire display region DA would be 8 mm in the horizontal direction and 6 mm in the vertical direction.

Next, the organic compound layer 3 was formed on the lower electrodes 2. More specifically, a hole injection layer with a thickness of 3 nm was formed by using Compound 1 indicated below. Next, a hole transport layer with a thickness of 15 nm was formed by using Compound 2 indicated below, and an electron blocking layer with a thickness of 10 nm was formed by using Compound 3 indicated below.

A first light emitting layer with a thickness of 10 nm was formed by adjusting so that Compound 4, indicated below, as the host material would have a weight ratio of 97% and Compound 5, indicated below, as the light emitting dopant, would have a weight ratio of 3%. A second light emitting layer with a thickness of 10 nm was formed by adjusting so that Compound 4, indicated below, as the host material would have a weight ratio of 98% and Compound 6 and Compound 7, both indicated below, as the light emitting dopants, would each have a weight ratio of 1%. An electron transport layer with a thickness of 110 nm was formed by using Compound 8 indicated below. An electron injection layer with a thickness of 1 nm was formed by using lithium fluoride.

Compound 1

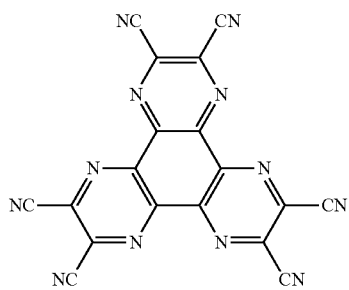

Compound 2

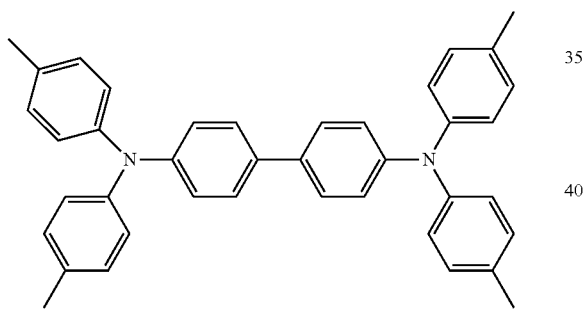

Compound 3

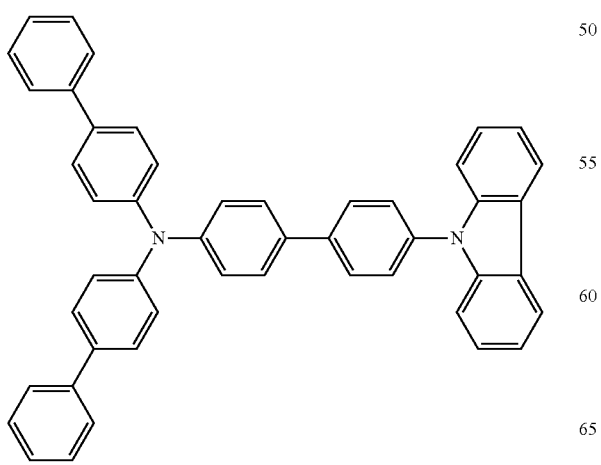

-continued

Compound 4

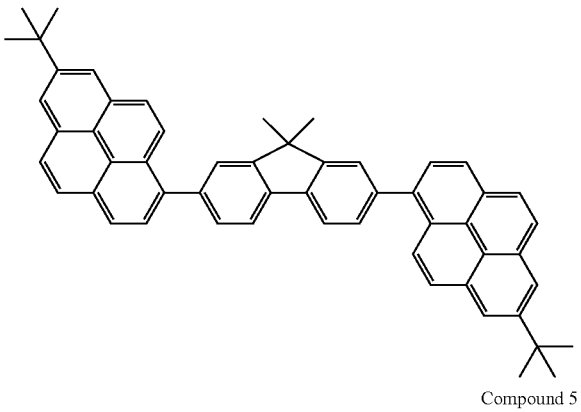

Compound 5

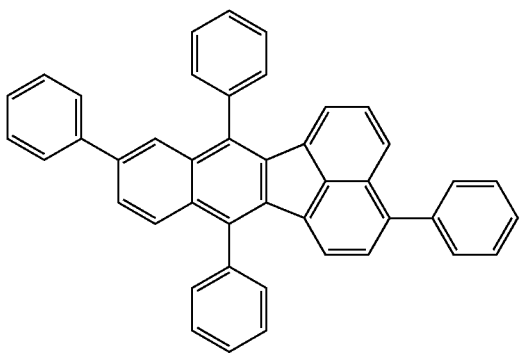

Compound 6

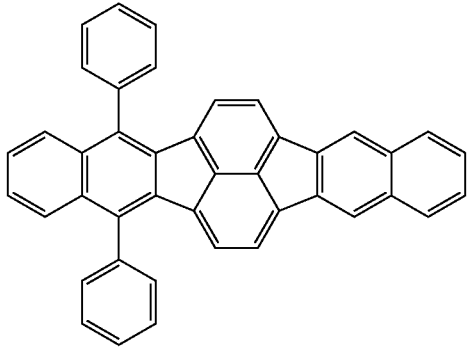

Compound 7

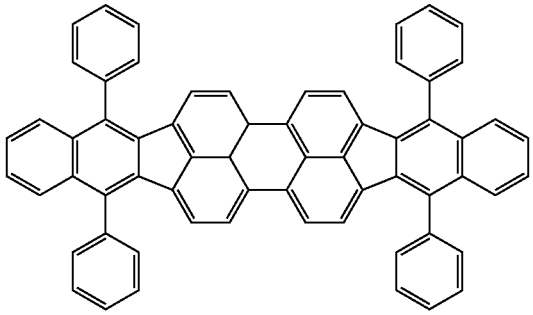

-continued

Compound 8

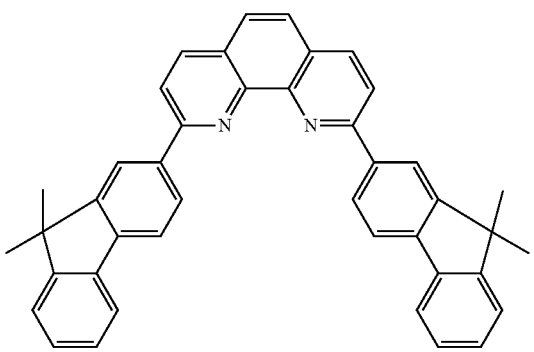

Next, the upper electrode 4 with a thickness of 10 nm was formed by using an alloy of magnesium and silver. The ratio between magnesium and silver was 1:1. Subsequently, the protective layer 6 made of silicon nitride with a thickness of 2 μm was formed by CVD. Furthermore, a resin layer with a thickness of 300 nm was formed as the planarization layer 7 by performing spin coating on the protective layer 6 made of silicon nitride.

Next, the color filter layer CFL was formed on the planarization layer 7. Each color filter 102 was set as the color filter for transmitting green light, each color filter 202 was set as a color filter for transmitting red light, and each color filter 302 was set as a color filter for transmitting blue light. The length 103 parallel to the first direction of each color filter 102 was set to 5.6 μm. The length 203 parallel to the first direction of each color filter 202 was set to 5.2 μm. The length 303 parallel to the first direction of each color filter 302 was set to 4.8 μm.

The pitch at which each color filter 102 was periodically arranged, the pitch at which each color filter 202 was periodically arranged, and the pitch at which each color filter 302 was periodically arranged were each set to 7.8016 μm. That is, the pitch at which the color filters 102, 202, and 302 were arranged were set to be larger by 200 ppm than the above-described pitch (7.8 μm) at which the light emitting regions 101, 201, and 301 were periodically arranged.

In the middle region DC of the display region DA, the center position of the color filter 102, the center position of the color filter 202, and the center position of the color filter 302 were arranged to match the center position of the light emitting region 101, the center position of the light emitting region 201, and the center position of the light emitting region 301, respectively. By arranging so that the pitch at which the color filters 102, 202, and 302 were periodically arranged would be larger than the pitch at which the light emitting regions 101, 201, and 301 were periodically arranged, it was confirmed that the center position of the color filter 102, the center position of the color filter 202, and the center position of the color filter 302 had shifted from the center position of the light emitting region 101, the center position of the light emitting region 201, and the center position of the light emitting region 301, respectively, by 0.8 μm in the peripheral direction in the most peripheral region (edge) of the display region DA. In addition, it was confirmed that the shift amount between the center position of each color filter 102 and the center position of each light emitting region 101, the shift amount between the center position of each color filter 202 and the center position of each light emitting region 201, and the shift amount between the center position of each color filter 302 to the center position of the light emitting region 301 had changed continuously from the display region DA to the peripheral regions DL and DR and further to the edge portions of the display region DA.

A flat glass substrate was used for the upper surface and the lower surface (bottom surface) of the counter substrate 9. The filling layer 8 formed by a photocuring acrylic resin was arranged between the counter substrate 9 and the color filter layer CFL.

In the arrangement of Example 1, the effect of the arrangement of the display device 10 according to this embodiment was confirmed by confirming that the reduction of the luminance of light traveling in the diagonal direction with respect to the normal direction of the display surface of the peripheral regions DL and DR in the display region DA was improved. In addition, an image displayed on the display region DA of the display device 10 via the optical system 20 was observed, and it was confirmed that generation of unevenness due to differences between the luminance and chromaticity of the middle portion DC and the luminance and chromaticity of the peripheral portions DL and DR was suppressed.

Example 2

The display device 10 was manufactured in a manner similar to that described in Example 1 up to the formation of the color filter layer CFL. After the formation of the color filter layer CFL, the filling layer 8 (planarization layer) was formed. Furthermore, in Example 2, the microlenses 105, 205, and 305 corresponding to the color filters 102, 202, and 302, respectively were formed on the filling layer 8 by using an acrylic resin. In Example 2, as shown in FIG. 9, the microlenses 105, 205, and 305 were formed so that the center positions of the microlenses 105, 205, and 305 of the pixels 100, 200, and 300 would match the center positions of the color filters 102, 202, and 302 of the pixels 100, 200, and 300, respectively.

The effect of the arrangement of the display device 10 according to this embodiment was confirmed in Example 2 as well by confirming that the reduction of the luminance of light traveling in the diagonal direction with respect to the normal direction of the display surface of the peripheral regions DL and DR in the display region DA was improved.

Example 3

The display device 10 was manufactured in a manner similar to that described in Example 2 up to the formation of the filling layer 8. The microlenses 105, 205, and 305 corresponding to the color filters 102, 202, and 302, respectively were formed on the filling layer 8 by using an acrylic resin. In Example 3, the microlenses 105, 205, and 305 were formed so that the center positions of the microlenses 105, 205, and 305 of the pixels 100, 200, and 300, respectively, would be shifted from the center positions of the corresponding color filters 102, 202, and 302 toward the peripheral region by 0.8 μm as shown in FIG. 10.

The effect of the arrangement of the display device 10 according to this embodiment was confirmed in Example 3 as well by confirming that the reduction of the luminance of light traveling in the diagonal direction with respect to the normal direction of the display surface of the peripheral regions DL and DR in the display region DA was improved.

Example 4

The display device 10 was manufactured in a manner similar to Example 3 other than the arrangement of the lower electrodes 2. In Example 4, as each lower electrode 2, an SiO layer for improving the light emission efficiency was formed between an aluminum layer with a thickness of 50 nm and an ITO layer with a thickness of 20 nm. The thickness of the SiO layer was changed for each of the pixels 100, 200, and 300. The film thickness of SiO of the pixel 100 was 150 nm, the film thickness of SiO of the pixel 200 was 200 nm, and the film thickness of SiO of the pixel 300 was 100 nm.

In the arrangement of Example 4, the effect of the arrangement of the display device 10 according to this embodiment was confirmed by confirming that the reduction of the luminance of light traveling in the diagonal direction with respect to the normal direction of the display surface of the peripheral regions DL and DR in the display region DA was improved.

In this manner, in each example, it was confirmed that the light emitted diagonally with respect to the normal direction of the display surface could be efficiently used in accordance with the color to be transmitted by the corresponding color filter to improve the image quality when the user observed an image displayed on the display region DA of the display device 10.

The present invention is not limited to the above embodiments and various changes and modifications can be made within the spirit and scope of the present invention. Therefore, to apprise the public of the scope of the present invention, the following claims are made.

According to the present invention, a technique advantageous in improving the image quality in a display device can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-172135, filed Oct. 12, 2020, which is hereby incorporated by reference herein in its entirety.

What is claimed is:

1. A display device that comprises a display region in which a plurality of pixels including a first pixel and a second pixel are arranged to be adjacent to each other along a first direction,
    wherein each of the plurality of pixels comprises a light emitting region and a color filter arranged over the light emitting region,
    wherein a center position of each color filter in an orthogonal projection with respect to the display region is arranged so as to be shifted closer to the first direction from a center position of a corresponding light emitting region in the orthogonal projection with respect to the display region,
    wherein luminous efficacy of light transmitted through the color filter of the first pixel is higher than luminous efficacy of light transmitted through the color filter of the second pixel,
    wherein in the orthogonal projection with respect to the display region, a length parallel to the first direction of the color filter of the first pixel is longer than a length parallel to the first direction of the color filter of the second pixel,
    wherein each first pixel is periodically arranged along the first direction,
    wherein the color filter of each first pixel is arranged at a predetermined pitch along the first direction,
    wherein the light emitting region of each first pixel is arranged at a predetermined pitch along the first direction, and
    wherein the pitch at which the color filter of each first pixel is arranged along the first direction and the pitch at which the light emitting region of each first pixel is arranged along the first direction are different from each other.

2. The device according to claim 1, wherein the length parallel to the first direction of the color filter of each of the first pixel and the second pixel is a length from an end, in a direction opposite to the first direction in an orthogonal projection to a bottom surface of the color filter with respect to the display region, to an end, in the first direction in an orthogonal projection to an upper surface of the color filter with respect to the display region.

3. The device according to claim 1, wherein each second pixel is periodically arranged along the first direction,
    wherein the color filter of each second pixel is arranged at a predetermined pitch along the first direction,
    wherein the light emitting region of each second pixel is arranged at a predetermined pitch along the first direction, and
    wherein the pitch at which the color filter of each second pixel is arranged along the first direction and the pitch at which the light emitting region of each second pixel is arranged along the first direction are different from each other.

4. The device according to claim 1, wherein each first pixel and each second pixel are periodically arranged along the first direction,
    wherein the pitch at which the color filter of each first pixel is arranged along the first direction and the pitch at which the color filter of each second pixel is arranged along the first direction are the same, and
    wherein the pitch at which the light emitting region of each first pixel is arranged along the first direction and the pitch at which the light emitting region of each second pixel is arranged along the first direction are the same.

5. The device according to claim 1, wherein the first direction is a direction from a middle of the display region to an edge of the display region.

6. The device according to claim 1, wherein the first direction is a direction from an edge of the display region to a middle of the display region.

7. The device according to claim 1, wherein an end of the color filter of the second pixel is arranged to overlap an end of the color filter of the first pixel.

8. The device according to claim 7, wherein the end, which is arranged on the color filter of the first pixel, of the color filter of the second pixel has a tapered shape.

9. The device according to claim 1, wherein each of the plurality of pixels further comprises a microlens arranged on the color filter, and
    wherein a center position of each microlens matches the center position of the corresponding color filter in the orthogonal projection with respect to the display region.

10. The device according to claim 1, wherein each of the plurality of pixels further comprises a microlens arranged on the color filter, and
    wherein a center position of each microlens is arranged so as to be shifted closer to the first direction from the center position of the corresponding color filter in the orthogonal projection with respect to the display region.

11. The device according to claim 1, wherein the color filter of the first pixel transmits green light, and
wherein the color filter of the second pixel transmits one of red light and blue light.

12. The device according to claim 1, wherein the plurality of pixels further comprise a third pixel arranged to be adjacent to the first pixel along the first direction, and the first pixel is arranged between the second pixel and the third pixel,
wherein the color filter of each of the second pixel and the third pixel transmits light of the same color, and
wherein in the orthogonal projection with respect to the display region, the length parallel to the first direction of the color filter of the first pixel is longer than a length parallel to the first direction of the color filter of the third pixel.

13. The device according to claim 12, wherein a distance from the center position of the color filter of the first pixel to the center position of the color filter of the second pixel and a distance from the center position of the color filter of the first pixel to the center position of the color filter of the third pixel are the same,
wherein a distance from the center position of the light emitting region of the first pixel to the center position of the light emitting region of the second pixel and a distance from the center position of the light emitting region of the first pixel to the center position of the light emitting region of the third pixel are the same, and
wherein a distance from a center of the color filter of the first pixel to a center of the color filter of the second pixel and a distance from a center of the light emitting region of the first pixel to a center of the light emitting region of the third pixel are different.

14. The device according to claim 12, wherein each third pixel is periodically arranged along the first direction,
wherein the color filter of each third pixel is arranged at a predetermined pitch along the first direction,
wherein the light emitting region of each third pixel is arranged at a predetermined pitch along the first direction, and
wherein the pitch at which the color filter of each third pixel is arranged along the first direction and the pitch at which the light emitting region of each third pixel is arranged along the first direction are different from each other.

15. The device according to claim 12, wherein the end of the color filter of each of the second pixel and the third pixel is arranged to overlap the end of the color filter of the first pixel, and
wherein a thickness of a portion, which is arranged on the color filter of the first pixel, of the color filter of the second pixel is smaller than a thickness of a portion, which is arranged on the color filter of the first pixel, of the color filter of the third pixel.

16. The device according to claim 1, wherein the plurality of pixels further comprise a third pixel arranged to be adjacent to the first pixel along the first direction, and the first pixel is arranged between the second pixel and the third pixel,
wherein the luminous efficacy of the light transmitted through the color filter of the first pixel is higher than luminous efficacy of the light transmitted through the color filter of the third pixel, and the color filter of the second pixel and the color filter of the third pixel transmit rays of light of different colors, and
wherein in the orthogonal projection with respect to the display region, the length parallel to the first direction of the color filter of the first pixel is longer than a length parallel to the first direction of the color filter of the third pixel.

17. The device according to claim 16, wherein an end of the color filter of the second pixel and an end of the color filter of the third pixel are arranged to overlap an end of the color filter of the first pixel, and
wherein a thickness of a portion, which is arranged on the color filter of the first pixel, of the color filter of the second pixel is thinner than a thickness of a portion, which is arranged on the color filter of the first pixel, of the color filter of the third pixel.

18. The device according to claim 1, wherein the second pixel is arranged on the side of the first direction with respect to the first pixel.

19. The device according to claim 1, wherein the light emitting region includes an organic light emitting element.

20. A photoelectric conversion device comprising:
an optical unit that includes a plurality of lenses;
an image capturing element configured to receive light that passed through the optical unit; and
a display unit configured to display an image,
wherein the display unit is a display unit configured to display an image captured by the image capturing element and includes the display device according to claim 1.

21. An electronic device comprising:
a housing in which a display unit is arranged; and
a communication unit arranged in the housing and configured to communicate with an external device,
wherein the display unit includes the display device according to claim 1.

22. A wearable device comprising:
a display unit configured to display an image,
wherein the display unit includes the display device according to claim 1.

23. The device according to claim 1, wherein in the orthogonal projection with respect to the display region, (1) the center position of the color filter of each of the plurality of pixels is a geometric center of the color filter of each of the plurality of pixels, and (2) the center position of the light emitting region of each of the plurality of pixels is a geometric center of the light emitting region of each of the plurality of pixels.

24. The device according to claim 1, wherein in a cross section perpendicular to the display region, (1) the center position of the color filter of each of the plurality of pixels is a midpoint of width of the color filter of each of the plurality of pixels, and (2) the center position of the light emitting region of each of the plurality of pixels is a midpoint of width of the light emitting region of each of the plurality of pixels.

25. The device according to claim 1, wherein in the orthogonal projection with respect to the display region, (1) the length parallel to the first direction of the color filter of each of the plurality of pixels is a length of a virtual line passing through the center of the color filter, parallel to the first direction, of each of the plurality of pixels, and (2) a length parallel to the first direction of the light emitting region of each of the plurality of pixels is a length of a virtual line passing through the center of the light emitting region, parallel to the first direction, of each of the plurality of pixels.

26. The device according to claim 1, wherein in a cross section perpendicular to the display region, (1) the length parallel to the first direction of the color filter of each of the plurality of pixels is a length of a longest virtual line passing through the color filter, parallel to the first direction, of each of the plurality of pixels, and (2) a length parallel to the first direction of the light emitting region of each of the plurality of pixels is a length of a longest virtual line passing through the light emitting region, parallel to the first direction, of each of the plurality of pixels.

27. The device according to claim 1, wherein the color filter of the first pixel and the color filter of the second pixel are in contact with each other.

28. A display device that comprises a display region in which a plurality of pixels including a first pixel and a second pixel are arranged to be adjacent to each other along a first direction,
- wherein each of the plurality of pixels comprises a light emitting region and a color filter arranged over the light emitting region,
- wherein a center position of each color filter in an orthogonal projection with respect to the display region is arranged so as to be shifted closer to the first direction from a center position of a corresponding light emitting region in the orthogonal projection with respect to the display region,
- wherein the color filter of the first pixel transmits green light and the color filter of the second pixel transmits one of red light and blue light, and
- wherein in the orthogonal projection with respect to the display region, a length parallel to the first direction of the color filter of the first pixel is longer than a length parallel to the first direction of the color filter of the second pixel.

29. The device according to claim 28, wherein the length parallel to the first direction of the color filter of each of the first pixel and the second pixel is a length from an end, in a direction opposite to the first direction in an orthogonal projection to a bottom surface of the color filter with respect to the display region, to an end, in the first direction in an orthogonal projection to an upper surface of the color filter with respect to the display region.

30. The device according to claim 28, wherein a pitch at which the color filter of each first pixel is arranged along the first direction and a pitch at which the light emitting region of each first pixel is arranged along the first direction are different from each other.

31. The device according to claim 28, wherein the plurality of pixels further comprise a third pixel arranged to be adjacent to the first pixel along the first direction, and the first pixel is arranged between the second pixel and the third pixel,
- wherein the color filter of the third pixel transmits one of red light and blue light, and
- wherein in the orthogonal projection with respect to the display region, the length parallel to the first direction of the color filter of the first pixel is longer than a length parallel to the first direction of the color filter of the third pixel.

32. The device according to claim 31, wherein an end of the color filter of the second pixel and an end of the color filter of the third pixel are arranged to overlap an end of the color filter of the first pixel, and
- wherein a thickness of a portion, which is arranged on the color filter of the first pixel, of the color filter of the second pixel is thinner than a thickness of a portion, which is arranged on the color filter of the first pixel, of the color filter of the third pixel.

33. The device according to claim 32, wherein the second pixel is arranged on the side of the first direction with respect to the first pixel, and the third pixel is arranged on the side opposite to the first direction with respect to the first pixel.

34. The device according to claim 28, wherein the color filter of the first pixel and the color filter of the second pixel are in contact with each other.

35. The device according to claim 28, wherein in a cross section perpendicular to the display region, (1) a length of an upper surface of the color filter of the first pixel from an end in a direction opposite to the first direction to an end in the first direction is defined as a first distance, (2) a length of a bottom surface of the color filter of the first pixel from an end in a direction opposite to the first direction to an end in the first direction is defined as a second distance, and (3) a length of a portion between the upper surface and the bottom surface of the color filter of the first pixel from an end in a direction opposite to the first direction to an end in the first direction is defined as a third distance, and
- wherein the third distance is longer than each of the first distance and the second distance.

* * * * *